US012777736B2

(12) United States Patent
Kang et al.

(10) Patent No.: US 12,777,736 B2
(45) Date of Patent: Oct. 27, 2026

(54) IMAGE SENSOR

(71) Applicant: Samsung Electronics Co., Ltd., Suwon-si (KR)

(72) Inventors: Seungkuk Kang, Suwon-si (KR); Taeyon Lee, Suwon-si (KR); Hyo Eun Kim, Suwon-si (KR); Gyuseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 336 days.

(21) Appl. No.: 18/504,674

(22) Filed: Nov. 8, 2023

(65) Prior Publication Data

US 2024/0290812 A1 Aug. 29, 2024

(30) Foreign Application Priority Data

Feb. 24, 2023 (KR) ........................ 10-2023-0025140

(51) Int. Cl.
*H10F 39/00* (2025.01)

(52) U.S. Cl.
CPC ......... *H10F 39/811* (2025.01); *H10F 39/018* (2025.01); *H10F 39/809* (2025.01)

(58) Field of Classification Search
CPC .... H10F 39/811; H10F 39/018; H10F 39/809; H10F 39/199; H10F 39/8053; H10F 39/8063; H10F 39/807; H10F 39/804; H10F 39/014; H10F 39/18
See application file for complete search history.

(56) References Cited

U.S. PATENT DOCUMENTS

| | | | | |
|---|---|---|---|---|
| 9,412,725 | B2 * | 8/2016 | Chen | H10F 39/018 |
| 10,026,769 | B2 * | 7/2018 | Kagawa | H10F 39/811 |
| 10,224,312 | B1 | 3/2019 | Jones | |
| 10,978,505 | B2 * | 4/2021 | Sato | H10F 39/809 |
| 11,018,110 | B2 | 5/2021 | Hirata et al. | |
| 11,031,431 | B2 | 6/2021 | Fujii et al. | |
| 11,069,637 | B2 | 7/2021 | Kameshima | |
| 11,075,242 | B2 * | 7/2021 | Kuo | H10F 77/413 |
| 11,380,638 | B2 | 7/2022 | Tagami | |

(Continued)

FOREIGN PATENT DOCUMENTS

| | | | |
|---|---|---|---|
| KR | 1020120063202 | A | 6/2012 |
| KR | 20220022504 | A | 2/2022 |
| KR | 1020220060612 | A | 5/2022 |

*Primary Examiner* — Eduardo A Rodela
(74) *Attorney, Agent, or Firm* — Muir Patent Law, PLLC

(57) ABSTRACT

An image sensor comprising a circuit chip and an image sensor chip on the circuit chip. The image sensor chip includes a first substrate extending in a first direction and a second direction, a first interlayer dielectric layer between the first substrate and the circuit chip, and a first bonding pad in the first interlayer dielectric layer and having a first width in a first direction. The circuit chip includes a second substrate, a second interlayer dielectric layer and a third interlayer dielectric layer that are sequentially stacked on the second substrate, and a second bonding pad in the second and third interlayer dielectric layers and having a second width in the first direction. The first and second bonding pads are in contact with each other. A change in the second width along a third direction is greater than a change in the first width along the third direction, the third direction intersects the first and second directions.

19 Claims, 14 Drawing Sheets

(56) References Cited

U.S. PATENT DOCUMENTS

| | | | | |
|---|---|---|---|---|
| 12,142,588 | B2 * | 11/2024 | Jang | H01L 23/3192 |
| 12,266,674 | B2 * | 4/2025 | Jang | H10F 39/802 |
| 12,364,047 | B2 * | 7/2025 | Kwon | H10F 39/018 |
| 12,484,323 | B2 * | 11/2025 | Chiou | H10F 39/018 |
| 12,490,537 | B2 * | 12/2025 | Chen | H10F 39/807 |
| 2011/0155893 | A1 * | 6/2011 | Endo | H04N 25/767 257/292 |
| 2012/0138968 | A1 | 6/2012 | Shin et al. | |
| 2014/0077057 | A1 * | 3/2014 | Chao | H10F 39/813 257/E31.084 |
| 2015/0364434 | A1 | 12/2015 | Chen et al. | |
| 2019/0123088 | A1 * | 4/2019 | Kwon | H10F 39/809 |
| 2019/0157333 | A1 * | 5/2019 | Tsai | H10F 39/809 |
| 2021/0118937 | A1 | 4/2021 | Tsugawa | |
| 2021/0313369 | A1 * | 10/2021 | Tange | H10F 39/8063 |
| 2022/0139944 | A1 | 5/2022 | Hwang et al. | |
| 2024/0038800 | A1 * | 2/2024 | Sulfridge | H10F 39/8053 |
| 2024/0079434 | A1 * | 3/2024 | Yang | H10F 39/809 |
| 2024/0347576 | A1 * | 10/2024 | Yang | H01L 23/5225 |
| 2024/0355859 | A1 * | 10/2024 | Yang | H10F 39/018 |

* cited by examiner

IMAGE SENSOR

CROSS-REFERENCE TO RELATED APPLICATION

This U.S. nonprovisional application claims priority under 35 U.S.C § 119 to Korean Patent Application No. 10-2023-0025140 filed on Feb. 24, 2023 in the Korean Intellectual Property Office, the disclosure of which is hereby incorporated by reference in its entirety.

BACKGROUND

Aspects of the present inventive concepts relate to an image sensor.

An image sensor is a device to convert optical images into electrical signals. An image sensor can be classified into a charge coupled device (CCD) type and a complementary metal oxide semiconductor (CMOS) type. A CMOS type image sensor is abbreviated to CIS (CMOS image sensor). The CIS has a plurality of two-dimensionally arranged pixels. Each of the pixels includes a photodiode. The photodiode serves to convert incident light into electrical signals.

SUMMARY

Some embodiments of the present inventive concepts provide an image sensor having improved electrical properties.

Some embodiments of the present inventive concepts provide an image sensor having an increased efficiency of fabrication process.

According to some embodiments of the present inventive concepts, an image sensor may comprise: a circuit chip; and an image sensor chip on the circuit chip. The image sensor chip may include: a first substrate extending in a first direction and a second direction; a first interlayer dielectric layer between the first substrate and the circuit chip; and a first bonding pad in the first interlayer dielectric layer, wherein the first bonding pad has a first width in a first direction. The circuit chip may include: a second substrate; a second interlayer dielectric layer and a third interlayer dielectric layer that are sequentially stacked on the second substrate; and a second bonding pad in the second and third interlayer dielectric layers, wherein the second bonding pad has a second width in the first direction. The first and second bonding pads may be in contact with each other. A change in the second width along a third direction is greater than a change in the first width along the third direction, the third direction intersects the first direction and the second direction.

According to some embodiments of the present inventive concepts, an image sensor may comprise: a circuit chip; and an image sensor chip on the circuit chip. The image sensor chip may include: a first substrate; a first interlayer dielectric layer between the first substrate and the circuit chip; and a first bonding pad in the first interlayer dielectric layer. The circuit chip may include: a second substrate; a second interlayer dielectric layer on the second substrate; and a second bonding pad in the second interlayer dielectric layer. The first and second bonding pads may be in contact with each other. A plurality of voids may be included between the first and second bonding pads that are in contact with each other.

According to some embodiments of the present inventive concepts, an image sensor may comprise: a circuit chip; and an image sensor chip on the circuit chip. The image sensor chip may include: a first substrate that has a first surface and a second surface that are opposite to each other and photoelectric conversion areas, wherein the first substrate includes a pixel region and an optical black region; a separation pattern that defines the photoelectric conversion areas in the first substrate; a dielectric layer that covers the first surface; a plurality of color filters on the dielectric layer; a protective layer between the dielectric layer and the color filters; a plurality of microlenses on corresponding color filters; a device isolation pattern adjacent to the second surface, the device isolation pattern defining an active area; a buried gate pattern on the second surface; a first wiring layer on the buried gate pattern; and a first bonding pad between the first wiring layer and the circuit chip. The circuit chip may include: a second substrate on which integrated circuits are provided; a second wiring layer on the second substrate; and a second bonding pad between the second wiring layer and the image sensor chip. The first wiring layer and the second wiring layer may face each other and may be electrically connected through the first and second bonding pads. The first and second bonding pads may be bonded to each other. The first bonding pad may have a first sidewall and a second sidewall that are opposite to each other. The first sidewall may have a negative slope. The second sidewall may have a positive slope. The second bonding pad may have a third sidewall and a fourth sidewall that are opposite to each other. Each of the third and fourth sidewalls may have a stepped structure.

DETAILED DESCRIPTION OF EMBODIMENTS

Figure 1:
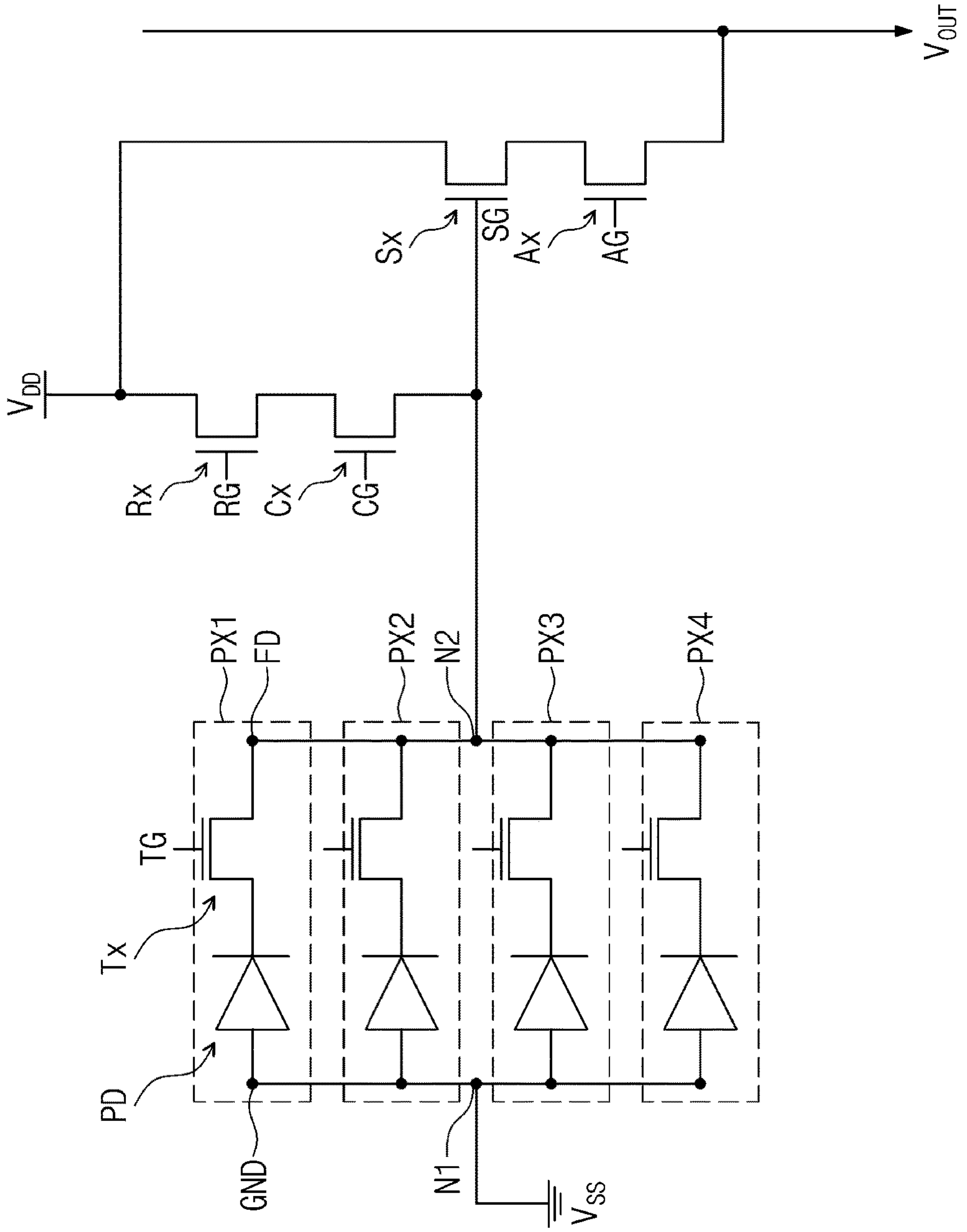
FIG. 1 illustrates a circuit diagram showing an image sensor according to some embodiments of the present inventive concepts.

FIG. 1 illustrates a circuit diagram showing a pixel of an image sensor according to some embodiments of the present inventive concepts.

Referring to FIG. 1, an image sensor may include first to fourth pixels PX1 to PX4. Each of the first to fourth pixels PX1 to PX4 may include a ground area GND, a photoelectric conversion area PD, a transfer transistor Tx, and a floating diffusion area FD. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The ground area GND may include a p type impurity area. A ground voltage $V_{SS}$ may be applied in common through a first node N1 to the ground areas GND of the first to fourth pixels PX1 to PX4.

The photoelectric conversion area PD may be a photodiode that includes an n type impurity area and a p type impurity area. The floating diffusion area FD may include an n type impurity area. The floating diffusion area FD may serve as a drain of the transfer transistor Tx.

The floating diffusion areas FD of the first to fourth pixels PX1 to PX4 may be connected in common to a second node N2. The second node N2, which is connected to the floating diffusion areas FD of the first to fourth pixels PX1 to PX4, may be connected to a source of a conversion gain transistor Cx. The conversion gain transistor Cx may be connected to a reset transistor Rx.

The second node N2 may also be electrically connected to a source follower gate SG of a source follower transistor Sx. The source follower transistor Sx may be connected to a selection transistor Ax.

An operation of the image sensor will be explained below with reference to FIG. 1. First, a power voltage $V_{DD}$ may be applied to a drain of the reset transistor Rx and a drain of the source follower transistor Sx under a light-blocked state, such that the reset transistor Rx may be turned on to discharge charges that remain on the floating diffusion area FD. Thereafter, when the reset transistor Rx is turned off and external light is incident on the photoelectric conversion area PD, electron-hole pairs may be generated from the photoelectric conversion area PD. Holes may be transferred to and accumulated on a p type impurity area of the photoelectric conversion area PD, and electrons may be transferred to and accumulated on an n type impurity area of the photoelectric conversion area PD. When the transfer transistor Tx is turned on, charges such as electrons and holes may be transferred to and accumulated on the floating diffusion area FD. A gate bias of the source follower transistor Sx may change in proportion to an amount of the accumulated charges, and this may bring about a variation in source potential of the source follower transistor Sx. In this case, when the selection transistor Ax is turned on, charges may be read out as signals transmitted through a column line.

A wiring line may be electrically connected to at least one selected from a transfer gate TG, a source follower gate SG, a reset gate RG, and a selection gate AG. The wiring line may be configured to apply the power voltage $V_{DD}$ to the drain of the reset transistor Rx or the drain of the source follower transistor Sx. The wiring line may include a column line connected to the selection transistor Ax. The wiring line may include a first conductive structure 830 which will be discussed in FIG. 3.

FIG. 1 depicts by way of example the first to fourth pixels PX1 to PX4 that share the first node N1 and the second node N2, but aspects of the present inventive concepts are not limited thereto.

Figure 2:
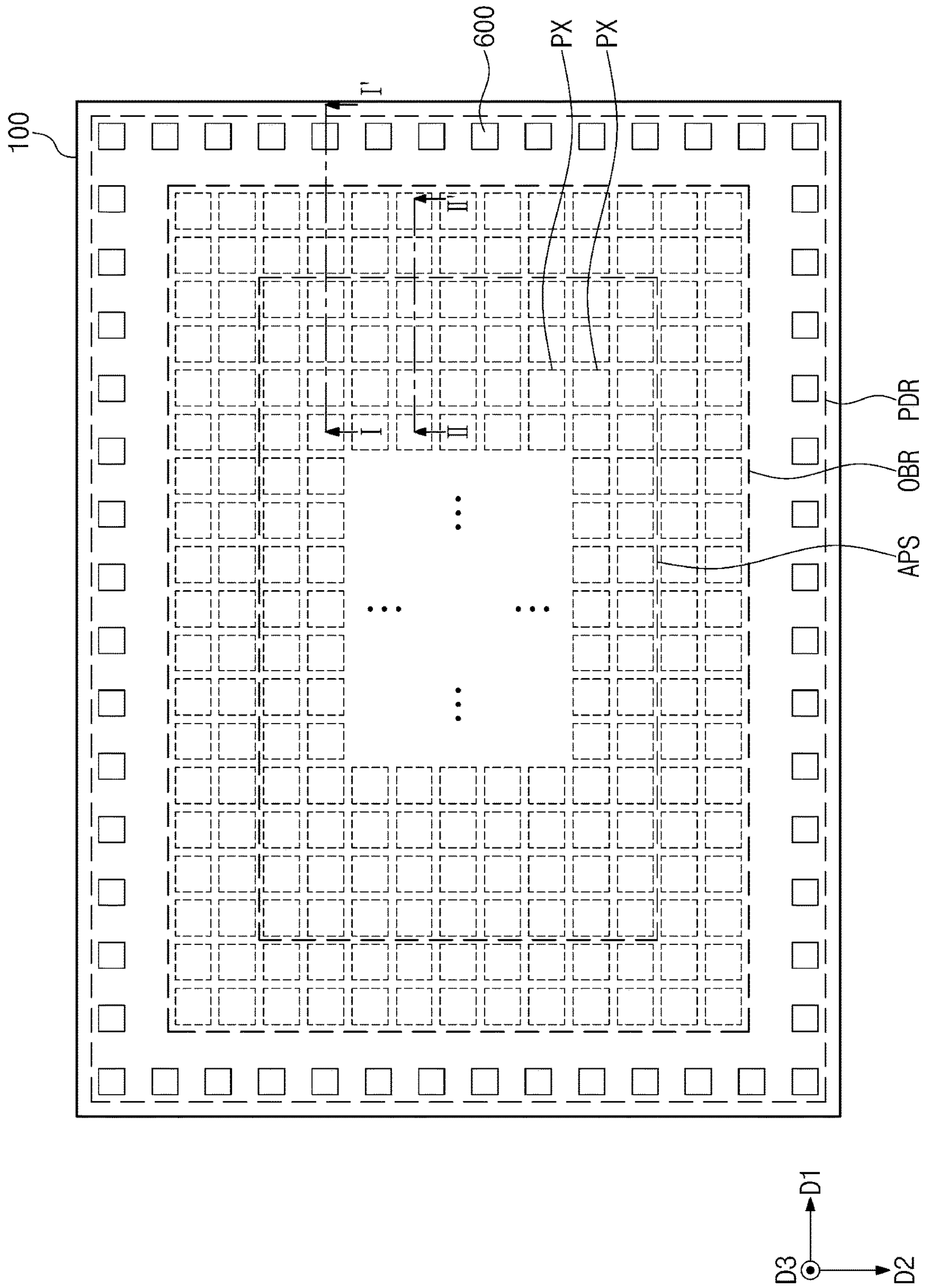
FIG. 2 illustrates a plan view showing an image sensor according to some embodiments of the present inventive concepts.
Figure 3:
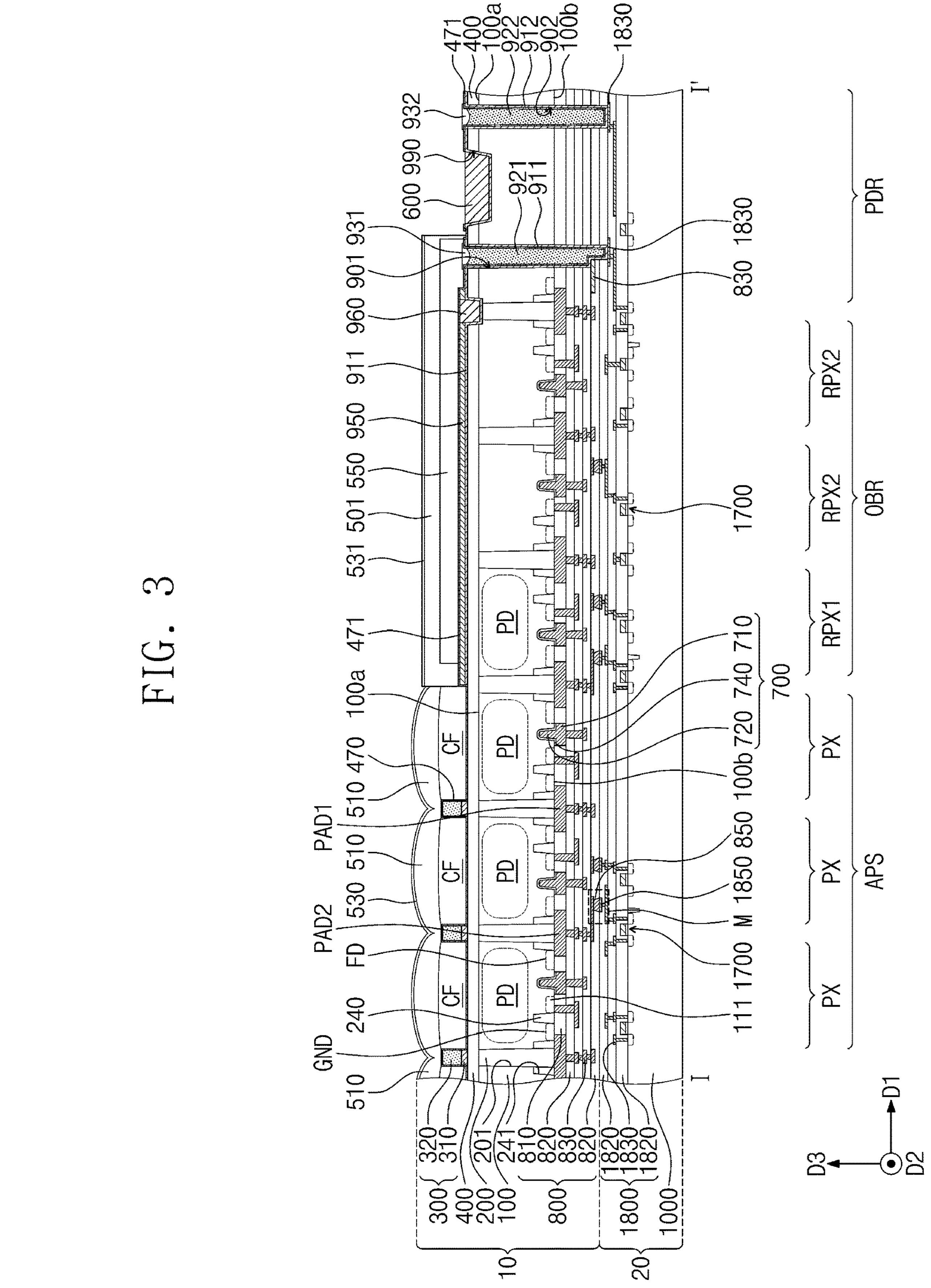
FIG. 3 illustrates a cross-sectional view taken along line I-I' of FIG. 2.

FIG. 2 illustrates a plan view showing an image sensor according to some embodiments of the present inventive concepts. FIG. 3 illustrates a cross-sectional view taken along line I-I' of FIG. 2.

Referring to FIGS. 2 and 3, an image sensor may include a sensor chip 10 (i.e., "image sensor chip"). The sensor chip 10 may include a first substrate 100, a first wiring layer 800, a dielectric layer 400, a protective layer 470, color filters CF, a fence pattern 300, and a microlens layer 500.

When viewed in plan, the first substrate 100 may include a pixel array region APS, an optical black region OBR, and a pad region PDR. The pixel array region APS may be disposed on a central portion of the first substrate 100. The pixel array region APS may include a plurality of pixel regions PX. A pixel, as discussed with reference to FIG. 1, may be provided to each of pixel regions PX of the first substrate 100. For example, components of the pixel depicted in FIG. 1 may be provided to each of the pixel regions PX. The pixel regions PX may output photoelectric signals from incident light.

The pixel regions PX may be two-dimensionally arranged in rows and columns. The rows may be parallel to a first direction D1. The columns may be parallel to a second direction D2. In this description, the first direction D1 may be parallel to a first surface 100*a* of the first substrate 100. The second direction D2 may be parallel to the first surface 100*a* of the first substrate 100 and may intersect the first direction D1. For example, the second direction D2 may be substantially orthogonal to the first direction D1. A third direction D3 may be perpendicular to the first and second directions D1 and D2. For example, the third direction D3 may be substantially perpendicular to the first surface 100*a* of the first substrate 100.

The pad region PDR may surround the pixel array region APS, while being provided on an edge portion of the first substrate 100. The pad region PDR may be provided with pads PAD thereon. The pads PAD may externally output electrical signals generated from the pixel regions PX. Alternatively, external electrical signals or voltages may be transferred through the pads PAD to the pixel regions PX. As the pad region PDR is disposed on the edge portion of the first substrate 100, the pads PAD may be easily coupled to an external apparatus. The optical black region OBR will be described below. The following description will focus on the pixel array region APS of the sensor chip 10 included in the image sensor.

The first substrate 100 may have a first surface 100*a* and a second surface 100*b* that are opposite to each other. The first surface 100*a* may be a rear surface of the first substrate 100, and the second surface 100*b* may be a front surface of the first substrate 100. The first substrate 100 may receive light on the first surface 100*a*. The first substrate 100 may be a semiconductor substrate or a silicon-on-insulator (SOI) substrate. The semiconductor substrate may be, for example, a silicon substrate, a germanium substrate, or a silicon-germanium substrate. The first substrate 100 may further include a III-group element. The III-group element may be an impurity having a first conductivity type. For example, the first substrate 100 may have the first conductivity type, for example, p type. For example, impurities having the first conductivity type may include one or more of aluminum (Al), boron (B), indium (In), and gallium (Ga).

The first substrate 100 may include a plurality of photoelectric conversion areas PD therein. The photoelectric conversion areas PD may be positioned between the first surface 100*a* and the second surface 100*b* of the first substrate 100. The photoelectric conversion areas PD may be correspondingly provided in the pixel regions PX of the first substrate 100. The photoelectric conversion area PD of FIG. 3 may be the same as the photoelectric conversion area PD of FIG. 1.

The photoelectric conversion area PD may further include a V-group element. The V-group element may be an impurity having a second conductivity type. For example, the photoelectric conversion area PD may be an impurity area having the second conductivity type. The second conductivity type may be an n type different from the first conductivity type. The impurities having the second conductivity type may include one or more of phosphorus, arsenic, bismuth, and antimony. The photoelectric conversion area PD may be adjacent to the first surface 100*a* of the first substrate 100. The photoelectric conversion area PD may extend from the first surface 100*a* toward the second surface 100*b*.

The first substrate 100 may be provided therein with a separation pattern 200 that defines the pixel regions PX. For example, the separation pattern 200 may be provided between neighboring pixel regions PX. The separation pattern 200 may be a pixel isolation pattern. The separation pattern 200 may be provided in a first trench 201. The first trench 201 may be recessed from the second surface 100*b* toward the first surface 100*a* of the first substrate 100.

The separation pattern 200 may be a deep trench isolation (DTI) layer. According to the present embodiment, the separation pattern 200 may penetrate the first substrate 100. In some embodiments of the present inventive concepts, the separation pattern 200 may not penetrate the first substrate 100, and rather may be spaced apart from the first surface 100*a* of the first substrate 100. A width of the separation pattern 200 adjacent to the second surface 100*b* may be greater than the width of the separation pattern 200 adjacent to the first surface 100*a*.

The first substrate 100 may be provided on the first surface 100*a* with the color filters CF located on corresponding pixel regions PX. For example, the color filters CF may be provided on locations that correspond to the photoelectric conversion areas PD. Each of the color filters CF may include one of red, blue, and green filters. The color filters CF may constitute color filter arrays. For example, the color filters CF may be two-dimensionally arranged in Bayer pattern format.

The fence pattern 300 may be disposed on the separation pattern 200. For example, the fence pattern 300 may vertically overlap the separation pattern 200. The fence pattern 300 may be interposed between and separate two neighboring color filters CF. For example, the fence pattern 300 may physically and optically separate the color filters CF from each other.

The fence pattern 300 may have a planar shape that corresponds to that of the separation pattern 200. For example, the fence pattern 300 may have a grid shape. When viewed in plan, the fence pattern 300 may surround each of the pixel regions PX. The fence pattern 300 may surround each of the color filters CF. The fence pattern 300 may include first segments and second segments. The first segments may extend parallel to the first direction D1 and may be spaced apart from each other in the second direction D2. The second segments may extend parallel to the second direction D2 and may be spaced apart from each other in the first direction D1. The second segments may intersect the first segments.

The fence pattern 300 may include a first fence pattern 310 and a second fence pattern 320. The first fence pattern 310 may be disposed between the dielectric layer 400 and the second fence pattern 320. The first fence pattern 310 may include a conductive material, such as one or more of metal and metal nitride. For example, the first fence pattern 310 may include one or more of titanium and titanium nitride.

The second fence pattern 320 may be disposed on the first fence pattern 310. The second fence pattern 320 may contact the first fence pattern 310. The second fence pattern 320 may include a different material from that of the first fence pattern 310. The second fence pattern 320 may include an organic material. The second fence pattern 320 may include a material whose refractive index is low and may have dielectric properties.

The dielectric layer 400 may be interposed between the first substrate 100 and the color filters CF and between the separation pattern 200 and the fence pattern 300. The dielectric layer 400 may cover the first surface 100*a* of the first substrate 100 and a top surface of the separation pattern 200. The dielectric layer 400 may be a backside dielectric layer. The dielectric layer 400 may include a bottom anti-reflective coating (BARC) layer. The dielectric layer 400 may include a plurality of layers, wherein the layers may have different functions from each other.

In an embodiment of the present inventive concepts, the dielectric layer 400 may include a first dielectric layer, a second dielectric layer, a third dielectric layer, a fourth dielectric layer, and a fifth dielectric layer that are sequentially stacked on the first surface 100*a* of the first substrate 100. The first dielectric layer may cover the first surface 100*a* of the first substrate 100. The first and second dielectric layers may be fixed charge layers. Each of the fixed charge layers may be formed of a metal oxide layer or a metal fluoride layer. The metal oxide layer may include oxygen whose amount is less than a stoichiometric ratio, and the metal fluoride layer may include fluorine whose amount is less than a stoichiometric ratio.

For example, the first dielectric layer may include metal oxide or metal fluoride that includes at least one metal selected from hafnium (Hf), zirconium (Zr), aluminum (Al), tantalum (Ta), titanium (Ti), yttrium (Y), and lanthanide. The second dielectric layer may include one of metal oxide and metal fluoride that are discussed in the example of the first dielectric layer. However, the second dielectric layer may include a different material from that of the first dielectric layer. For example, the first dielectric layer may include aluminum oxide, and the second dielectric layer may include hafnium oxide.

Each of the first and second dielectric layers may have a negative fixed charge and may produce hole accumulation. The first and second dielectric layers may effectively reduce white spot and dark current of the first substrate 100. The second dielectric layer may have a thickness greater than that of the first dielectric layer.

The third dielectric layer may be disposed on the second dielectric layer. The third dielectric layer may include a first silicon-containing material. The first silicon-containing material may include, for example, tetraethylorthosilicate (TEOS) or silicon oxide. The third dielectric layer may have good filling properties. The third dielectric layer may be formed by plasma enhanced chemical vapor deposition (PECVD), but aspects of the present inventive concepts are not limited thereto. The third dielectric layer may have a thickness greater than that of the first dielectric layer and that of the second dielectric layer.

The fourth dielectric layer may be disposed on the third dielectric layer. The fourth dielectric layer may include a different material from that of the third dielectric layer. The fourth dielectric layer may include a second silicon-containing material, and the second silicon-containing material may be different from the first silicon-containing material. For example, the fourth dielectric layer may include silicon nitride. The fourth dielectric layer may have a thickness greater than that of the third dielectric layer.

The fifth dielectric layer may be disposed between the fourth dielectric layer and the first fence pattern 310 and between the fourth dielectric layer and the color filters CF. The fifth dielectric layer may be in physical contact with a bottom surface of the first fence pattern 310. The fifth dielectric layer may be an adhesive layer or a capping layer. The fifth dielectric layer may include a high-k dielectric material or metal oxide. The fifth dielectric layer may include the same material as that of the second dielectric layer. For example, the fifth dielectric layer may include hafnium oxide. The fifth dielectric layer may have a thickness greater than that of each of the first and second dielectric layers and less than that of each of the third and fourth dielectric layers.

Differently from the embodiment discussed in detail above, the number of layers included in the dielectric layer 400 may be variously changed. For example, at least one of the first to fifth dielectric layers may be omitted.

The protective layer 470 may cover the dielectric layer 400 and the fence pattern 300. The protective layer 470 may include a high-k dielectric material and may have dielectric properties. For example, the protective layer 470 may include aluminum oxide or hafnium oxide. The protective layer 470 may include aluminum oxide, but aspects of the present inventive concepts are not limited thereto. The protective layer 470 may protect the photoelectric conversion areas PD of the first substrate 100 against external environmental elements such as moisture.

The color filters CF may be provided on the protective layer 470. The fence pattern 300 may separate the color filters CF from each other. The color filters CF may not cover a top surface of the fence pattern 300.

In an embodiment of the present inventive concepts, referring to FIG. 3, each of the color filters CF may have a top surface that is upwardly convex. For example, the color filter CF may be shaped such that a center of the top surface is located at a higher level than that of an edge of the top surface. The cross-shapes of the color filters CF, however, are not limited thereto.

Figure 4:
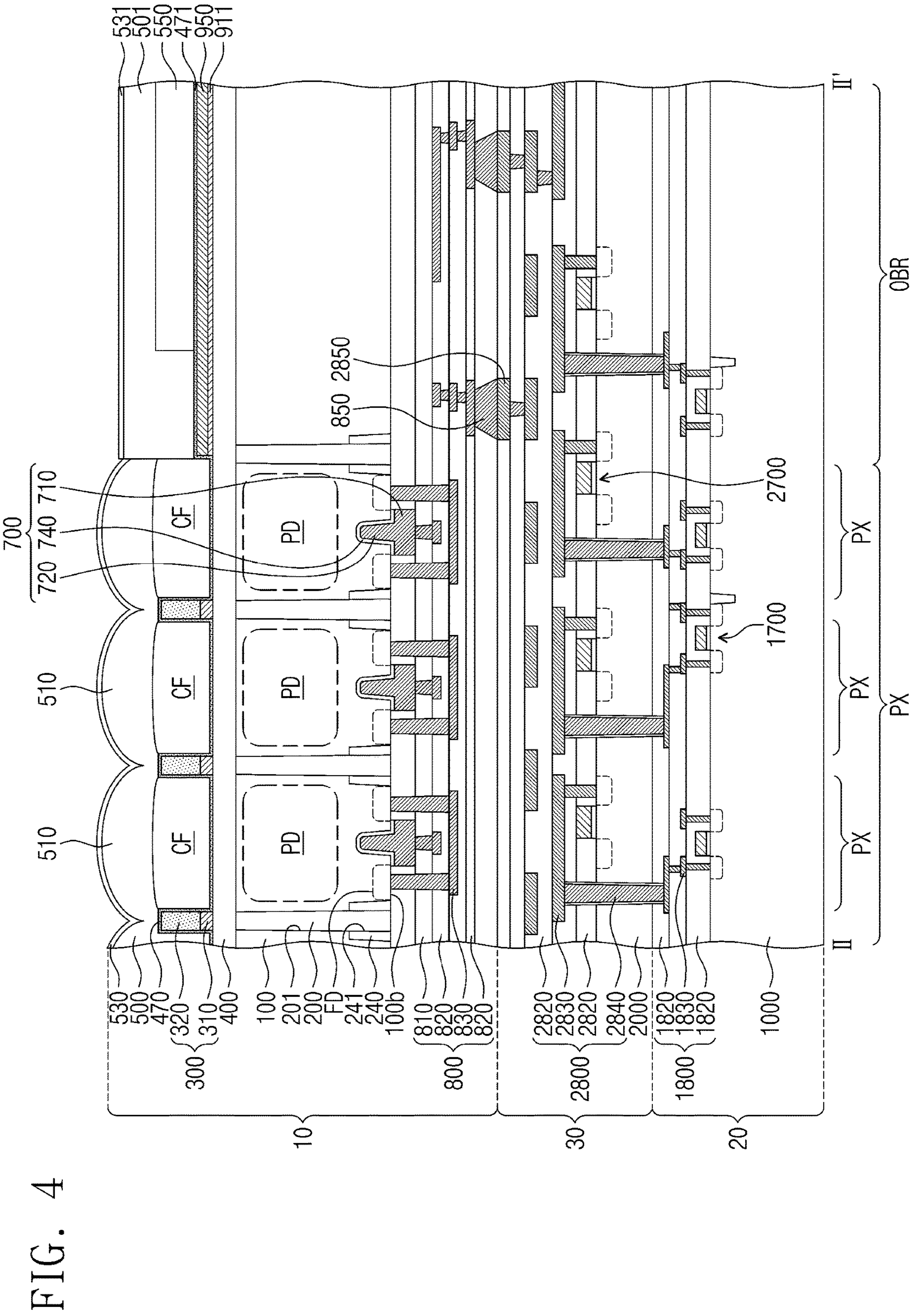
FIG. 4 illustrates a cross-sectional view taken along line II-II' of FIG. 2.

As illustrated, for example, in FIG. 4, the microlens layer 500 may be provided on the first surface 100*a* of the first substrate 100. For example, the microlens layer 500 may be provided on the color filters CF and the fence pattern 300. The protective layer 470 may be interposed between the second fence pattern 320 and the microlens layer 500.

The microlens layer 500 may include a plurality of convex microlenses 510. The microlenses 510 may be correspondingly provided on positions that correspond to the photoelectric conversion areas PD of the first substrate 100. For example, the microlenses 510 may be provided on and correspond to the color filters CF. When viewed in plan, the microlenses 510 may be arranged along the first direction D1 and the second direction D2. Each of the microlenses 510 may protrude away from the first surface 100*a* of the first substrate 100. Each of the microlenses 510 may have a hemispheric cross-section. The microlenses 510 may concentrate incident light.

The microlens layer 500 may be transparent to light. The microlens layer 500 may include an organic material, such as a polymer. For example, the microlens layer 500 may include a photoresist material or a thermosetting resin.

The lens coating layer 530 may be provided on the microlens layer 500. The lens coating layer 530 may be transparent. The lens coating layer 530 may conformally cover a top surface of the microlens layer 500. The lens coating layer 530 may protect the microlens layer 500.

The first substrate 100 may include a ground area GND, a floating diffusion area FD, and an impurity area 111 that are adjacent to the second surface 100*b* of the first substrate 100. The ground area GND, the floating diffusion area FD, and the impurity area 111 may be disposed in each of the pixel regions PX. The ground area GND, the floating diffusion area FD, and the impurity area 111 may have their bottom surfaces each of which is perpendicularly spaced apart from the photoelectric conversion area PD.

The ground area GND may be heavily doped with impurities to have the first conductivity type (e.g., p+ type). The floating diffusion area FD and the impurity area 111 may each be doped with impurities to have the second conductivity type (e.g., n type).

The impurity area 111 may be an active area for operation of a transistor. The impurity area 111 may include a source/drain area of at least one selected from the conversion gain transistor Cx, the reset transistor Rx, the source/follower transistor Sx, and the selection transistor Ax that are discussed with reference to FIG. 1.

A device isolation pattern 240 may be provided adjacent to the second surface 100*b* of the first substrate 100. The device isolation pattern 240 may define an active area in the pixel region PX. For example, in the pixel region PX, the device isolation pattern 240 may define the ground area GND, the floating diffusion area FD, and the impurity area 111.

The device isolation pattern 240 may be provided in a second trench 241, and the second trench 241 may be recessed from the second surface 100*b* of the first substrate 100. The device isolation pattern 240 may be a shallow trench isolation (STI) layer. The device isolation pattern 240 may have a height less than that of the separation pattern 200. A portion of the device isolation pattern 240 may be connected to a sidewall of the separation pattern 200. The device isolation pattern 240 may include, for example, one or more of silicon oxide, silicon nitride, and silicon oxynitride.

A buried gate pattern 700 may be provided on the second surface 100*b* of the first substrate 100. The buried gate pattern 700 may include the transfer gate TG of the transfer transistor Tx discussed above in FIG. 1. Although not shown in FIG. 3, at least one additional gate pattern may be provided on each of the pixel regions PX.

The additional gate pattern may serve as a gate electrode of at least one selected from the conversion gain transistor Cx, the source follower transistor Sx, the reset transistor Rx, and the selection transistor Ax that are discussed above in FIG. 1. For example, the additional gate pattern may include one of the conversion gain gate CG, the source follower gate SG, the reset gate RG, and the selection gate AG.

The buried gate pattern 700 may have a buried type gate structure. For example, the buried gate pattern 700 may include a first part 710 and a second part 720. The first part 710 of the buried gate pattern 700 may be disposed on the second surface 100*b* of the first substrate 100. The second part 720 of the buried gate pattern 700 may be buried in the first substrate 100. The second part 720 of the buried gate pattern 700 may be connected to the first part 710 of the buried gate pattern 700. Differently from that shown, the buried gate pattern 700 may have a planar gate structure. In this case, the buried gate pattern 700 may not include the second part 720. The buried gate pattern 700 may include metal, metal silicide, polysilicon, or a combination thereof. The polysilicon may include doped polysilicon.

A gate dielectric pattern 740 may be interposed between the buried gate pattern 700 and the first substrate 100. The gate dielectric pattern 740 may include, for example, one or more of silicon-based dielectric materials (e.g., silicon oxide, silicon nitride, and/or silicon oxynitride) and high-k dielectric materials (e.g., hafnium oxide and/or aluminum oxide.

As illustrated, for example, in FIG. 3, a first pad PAD1 may be provided on the ground area GND. The first pad PAD1 may be provided on the second surface 100*b* of the first substrate 100. The first pad PAD1 may electrically connect to each other the ground areas GND of neighboring pixel regions PX. The first pad PAD1 may include the first node N1 discussed in FIG. 1.

A second pad PAD2 may be provided on the floating diffusion area FD. The second pad PAD2 may be provided on the second surface 100*b* of the first substrate 100. The second pad PAD2 may electrically connect to each other the ground areas GND of neighboring pixel regions PX. The second pad PAD2 may include the second node N2 discussed in FIG. 1.

The first and second pads PAD1 and PAD2 may include metal, metal silicide, polysilicon, or any combination thereof. For example, the first and second pads PAD1 and PAD2 may include doped polysilicon.

The first wiring layer 800 may be disposed on the second surface 100*b* of the first substrate 100. The first wiring layer 800 may include a first interlayer dielectric layer 810, second interlayer dielectric layers 820, a first conductive structure 830, and a first bonding pad 850. The first bonding pad 850 will be further discussed in detail together with a second bonding pad 1850 of a circuit chip 20. The first wiring layer 800 may include a plurality of second interlayer dielectric layers 820 stacked on the first interlayer dielectric layer 810.

The first interlayer dielectric layer 810 may cover the buried gate pattern 700 and the second surface 100*b* of the first substrate 100. The second interlayer dielectric layers 820 may be stacked on the first interlayer dielectric layer 810. The first and second interlayer dielectric layers 810 and 820 may include a silicon-based dielectric material, such as one or more of dielectric material, such as silicon oxide, silicon nitride, and silicon oxynitride.

A first conductive structure 830 may be provided in the first and second interlayer dielectric layers 810 and 820. The first conductive structure 830 may include contacts, wiring lines, and vias. The contact may be provided in the first interlayer dielectric layer 810 to come into connection with at least one selected from the buried gate pattern 700, the first pad PAD1, the second pad PAD2, and the impurity area 111. The wiring line of the first conductive structure 830 may be connected to the contact of the first conductive structure 830. The via of the first conductive structure 830 may penetrate at least one of the second interlayer dielectric layers 820 to connect to each other the wiring lines that are vertically adjacent to each other. The first conductive structure 830 may receive photoelectric signals that are output from the photoelectric conversion areas PD.

The following will describe the circuit chip 20 of the image sensor and will also describe the optical black region OBR and the pad region PDR of the first substrate 100. Referring back to FIGS. 2 and 3, the optical black region OBR of the first substrate 100 may be interposed between the pixel array region APS and the pad region PDR. The optical black region OBR may include a first reference pixel region RPX1 and a second reference pixel region RPX2. The first reference pixel region RPX1 may be disposed between the second reference pixel region RPX2 and the pixel array region APS. On the optical black region OBR, the photoelectric conversion area PD may be provided in the first reference pixel region RPX1. The photoelectric conversion area PD on the first reference pixel region RPX1 may have a planar area and a volume the same as those of each of the photoelectric conversion areas PD on the pixel regions PX. The photoelectric conversion area PD may not be provided in the second reference pixel region RPX2. The impurity areas 111, the buried gate pattern 700, and the device isolation pattern 240 may be disposed on each of the first and second reference pixel regions RPX1 and RPX2.

The dielectric layer 400 may extend from the pixel array region APS through the optical black region OBR onto the pad region PDR. A light-shield layer 950 may be provided on the optical black region OBR. The light-shield layer 950 may be disposed on a top surface of the dielectric layer 400. The light-shield layer 950 may prevent light from entering the photoelectric conversion area PD on the optical black region OBR. On the optical black region OBR, pixels of the first and second reference pixel regions RPX1 and RPX2 may output noise signals without outputting photoelectric signals. The noise signals may be generated from electrons produced due to heat or dark current. The light-shield layer 950 may not cover the pixel array region APS, and thus light may be incident on the photoelectric conversion areas PD on the pixel array region APS. The noise signals may be eliminated from photoelectric signals that are output from the pixel regions PX. The light-shield layer 950 may include metal, such as tungsten, copper, aluminum, or any alloy thereof.

On the optical black region OBR of the first substrate 100, a first conductive pattern 911 may be disposed between the dielectric layer 400 and the light-shield layer 950. The first conductive pattern 911 may serve as a barrier layer or an adhesive layer. The first conductive pattern 911 may include one or more of metal and metal nitride. For example, the first conductive pattern 911 may include metal, such copper, tungsten, aluminum, titanium, tantalum, or any alloy thereof. The first conductive pattern 911 may not extend onto the pixel array region APS of the first substrate 100.

On the optical black region OBR of the first substrate 100, a contact plug 960 may be provided on the first surface 100*a* of the first substrate 100. The contact plug 960 may be disposed on an outermost separation pattern 200 in the optical black region OBR. The first substrate 100 may be provided on its first surface 100*a* with a contact trench that penetrates the dielectric layer 400, and the contact plug 960 may be provided in the contact trench.

The contact plug 960 may include a different material from that of the light-shield layer 950. The contact plug 960 may include a metallic material, such as aluminum. The first conductive pattern 911 may extend between the contact plug 960 and the dielectric layer 400 and between the contact plug 960 and the separation pattern 200.

A protective dielectric layer 471 may be provided on the optical black region OBR. The protective dielectric layer 471 may be disposed on a top surface of the light-shield layer 950 and a top surface of the contact plug 960. The protective dielectric layer 471 may include the same material as that of the protective layer 470 and may be connected to the protective layer 470. The protective dielectric layer 471 and the protective layer 470 may be integrally formed into a single unitary body. Alternatively, the protective dielectric layer 471 may be formed by a process separate from that used for forming the protective layer 470, and may be spaced apart from the protective layer 470. The protective dielectric layer 471 may include a high-k dielectric material (e.g., aluminum oxide and/or hafnium oxide).

A filtering layer 550 may further be disposed on the first surface 100*a* on the optical black region OBR. The filtering layer 550 may cover a top surface of the protective dielectric layer 471. The filtering layer 550 may block light whose wavelength is different from that of light produced from the color filters CF. For example, the filtering layer 550 may block an infrared ray. The filtering layer 550 may include a blue color filter, but aspects of the present inventive concepts are not limited thereto.

An organic layer 501 may be provided on a top surface of the filtering layer 550. The organic layer 501 may be transparent. The organic layer 501 may have a top surface that is substantially flat. For example, the organic layer 501 may include a polymer. The organic layer 501 may have dielectric properties. According to an embodiment of the present inventive concepts, differently from that shown, the organic layer 501 may be connected to the microlens layer 500. The organic layer 501 may include the same material as that of the microlens layer 500.

A coating layer 531 may be provided on the organic layer 501. The coating layer 531 may conformally cover the top surface of the organic layer 501. The coating layer 531 may include a dielectric material and may be transparent. The coating layer 531 may include the same material as that of the lens coating layer 530.

The image sensor may further include the circuit chip 20. The circuit chip 20 may be stacked on the sensor chip 10. The circuit chip 20 may include a second wiring layer 1800 and a second substrate 1000. The second wiring layer 1800 may be interposed between the first wiring layer 800 and the second substrate 1000. Integrated circuits 1700 may be disposed on a top surface or in an inside of the second substrate 1000. The integrated circuits 1700 may include logic circuits, memory circuits, or any combination thereof. The integrated circuits 1700 may include, for example, transistors.

The second wiring layer 1800 may include third interlayer dielectric layers 1820, second conductive structures 1830, and a second bonding pad 1850. The third interlayer dielectric layer 1820 may include a plurality of sub-interlayer dielectric layers. For example, the third interlayer dielectric layer 1820 may include a first sub-interlayer dielectric layer (see 1821 of FIG. 5A) and a second sub-interlayer dielectric layer (see 1822 of FIG. 5A) on the first sub-interlayer dielectric layer 1821. The third interlayer dielectric layers 1820, the first sub-interlayer dielectric layer 1821, and the second sub-interlayer dielectric layer 1822 may include a silicon-based dielectric material, such as silicon oxide, silicon nitride, and silicon oxynitride.

The second conductive structures 1830 may be provided between or in the third interlayer dielectric layers 1820. The second conductive structures 1830 may be electrically connected to the integrated circuits 1700. The second conductive structures 1830 may further include via patterns, and the via patterns and the second conductive structures 1830 may be coupled to each other in the third interlayer dielectric layers 1820. The second bonding pad 1850 will be further discussed below.

An external bonding pad 600 may be provided on the pad region PDR of the first substrate 100. The external bonding pad 600 may be adjacent to the first surface 100*a* of the first substrate 100. The external bonding pad 600 may be buried in the first substrate 100. For example, a pad trench 990 may be defined on the first surface 100*a* of the first substrate 100 on the pad region PDR, and the external bonding pad 600 may be provided in the pad trench 990. The external bonding pad 600 may include metal, such as aluminum, copper, tungsten, titanium, tantalum, or any alloy thereof. In a mounting process of the image sensor, a bonding wire may be formed on and coupled to the external bonding pad 600. The external bonding pad 600 may be electrically connected through the bonding wire to an external apparatus.

A first through hole 901 may be defined adjacent to a first side of the external bonding pad 600. The first through hole 901 may be provided between the external bonding pad 600 and the contact plug 960. The first through hole 901 may penetrate the dielectric layer 400, the first substrate 100, and the first wiring layer 800. The first through hole 901 may further penetrate at least a portion of the second wiring layer 1800. The first through hole 901 may have a first bottom surface and a second bottom surface. The first bottom surface of the first through hole 901 may expose the first conductive structure 830. The second bottom surface of the first through hole 901 may be located at a lower level than that of the first bottom surface of the first through hole 901. The second bottom surface of the first through hole 901 may expose the second conductive structure 1830.

The first conductive pattern 911 may extend from the optical black region OBR onto the pad region PDR. The first conductive pattern 911 may cover an inner wall of the first through hole 901. The first conductive pattern 911 in the first through hole 901 may be in contact with a top surface of the first conductive structure 830.

The first conductive pattern 911 in the first through hole 901 may also be in contact with a top surface of the second conductive structure 1830. The second conductive structure 1830 may be electrically connected through the first conductive pattern 911 to the first conductive structure 830.

A first buried pattern 921 may be provided in the first through hole 901 to fill the first through hole 901. The first buried pattern 921 may include a low-refractive material and may have dielectric properties. The first buried pattern 921 may include the same material as that of the first fence pattern 310. The first buried pattern 921 may have a recess on a top surface thereof. For example, the top surface of the first buried pattern 921 may have a center lower than an edge of the top surface of the first buried pattern 921.

A first capping pattern 931 may be disposed on the top surface of the first buried pattern 921 to fill the recess of the first buried pattern 921. A top surface of the first capping pattern 931 may be substantially flat. The first capping pattern 931 may include a dielectric polymer, such as a photoresist material.

A second through hole 902 may be defined adjacent to a second side of the external bonding pad 600. The second through hole 902 may penetrate the dielectric layer 400, the first substrate 100, and the first wiring layer 800. The second through hole 902 may further penetrate a portion of the second wiring layer 1800 to expose the second conductive structure 1830.

A second conductive pattern 912 may be provided on the pad region PDR. The second conductive pattern 912 may be provided in the second through hole 902 to conformally cover a sidewall and a bottom surface of the second through hole 902. The second conductive pattern 912 may be electrically connected to the second conductive structure 1830.

The second conductive pattern 912 may be interposed between the external bonding pad 600 and the pad trench 990 to cover a bottom surface and a sidewall of the external bonding pad 600. When the image sensor operates, the integrated circuits 1700 of the circuit chip 20 may transceive electrical signals through the second conductive structure 1830, the second conductive pattern 912, and the external bonding pad 600.

A second buried pattern 922 may be provided in the second through hole 902 to fill the second through hole 902. The second buried pattern 922 may include a low-refractive material and may have dielectric properties. For example, the second buried pattern 922 may include the same material as that of the first fence pattern 310. The second buried pattern 922 may have a recess on a top surface thereof.

A second capping pattern 932 may be disposed on the top surface of the second buried pattern 922 to fill the recess of the second buried pattern 922. A top surface of the second capping pattern 932 may be substantially flat. The second capping pattern 932 may include a dielectric polymer, such as a photoresist material.

The protective dielectric layer 471 may extend from the optical black region OBR onto the pad region PDR. The protective dielectric layer 471 may be provided on the top surface of the dielectric layer 400 and may extend into the first through hole 901 and the second through hole 902. In the first through hole 901, the protective dielectric layer 471 may be interposed between the first conductive pattern 911 and the first buried pattern 921. In the second through hole 902, the protective dielectric layer 471 may be interposed between the second conductive pattern 912 and the second buried pattern 922. The protective dielectric layer 471 may expose the external bonding pad 600.

Figure 5A:
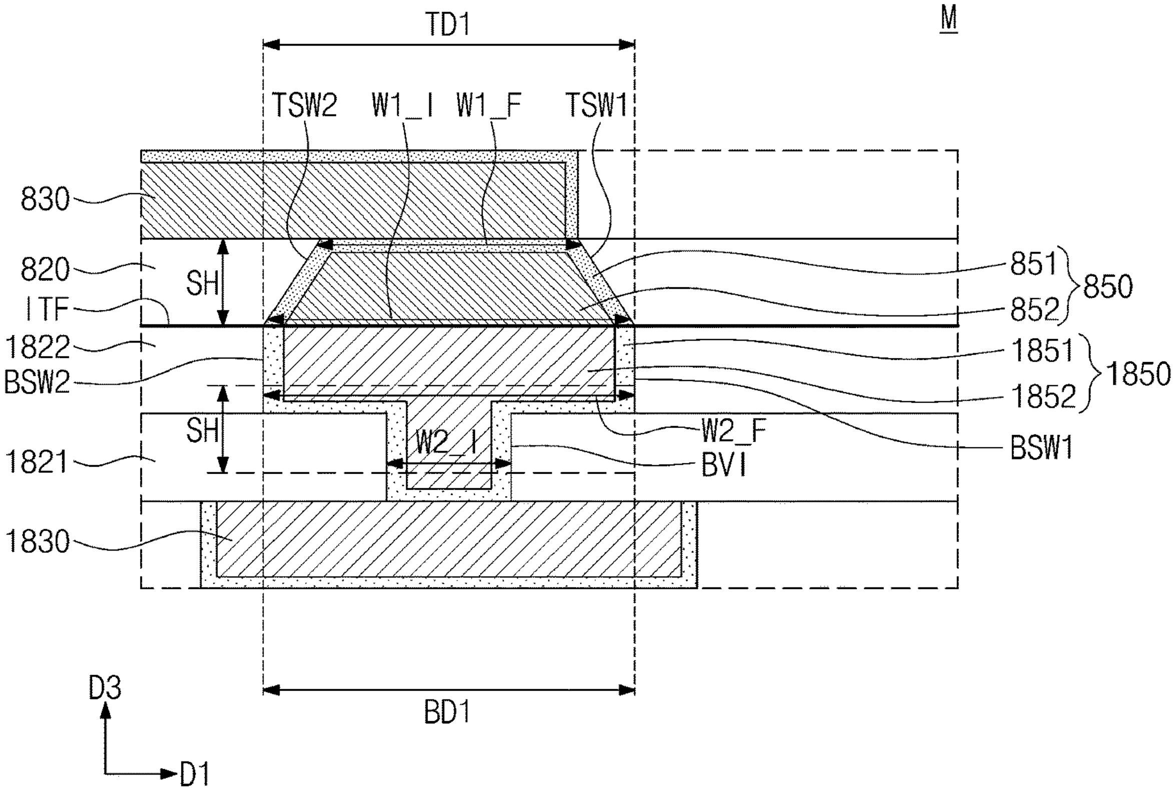
FIG. 5A illustrates an enlarged cross-sectional view of section M depicted in FIG. 3, showing bonding pads of an image sensor according to some embodiments of the present inventive concepts.

FIG. 5A illustrates an enlarged cross-sectional view of section M depicted in FIG. 3, showing bonding pads of an image sensor according to some embodiments of the present inventive concepts. The following will describe in detail the first bonding pad 850 and the second bonding pad 1850 of the image sensor.

Referring to FIGS. 3 and 5A, the first bonding pad 850 may be exposed on a bottom surface of the sensor chip 10. The first bonding pad 850 may be disposed in a lowermost second interlayer dielectric layer 820. The first bonding pad 850 may be electrically connected to the first conductive structure 830. A top surface of the first bonding pad 850 may be in partial contact with a bottom surface of the first conductive structure 830.

The first bonding pad 850 may include a first barrier pattern 851 and a first metal pattern 852. The first barrier pattern 851 may be provided on a top surface and sidewalls of the first metal pattern 852. As will be discussed below, in a process for forming the first barrier pattern 851, the first barrier pattern 851 may conformally cover a recess in the lowermost second interlayer dielectric layer 820. The first barrier pattern 851 may include at least one selected from titanium, tantalum, tungsten, and conductive metal nitride thereof. A top surface of the first barrier pattern 851 may be in contact with the first conductive structure 830. It will be understood that when an element is referred to as being “connected” or “coupled” to or “on” another element, it can be directly connected or coupled to or on the other element or intervening elements may be present. In contrast, when an element is referred to as being “directly connected” or “directly coupled” to another element, or as “contacting,” “in contact with,” or “contact” another element, there are no intervening elements present at the point of contact.

The first metal pattern 852 may be provided in the second interlayer dielectric layer 820. The first metal pattern 852 may be interposed between the first barrier pattern 851 and a second metal pattern 1852 which will be discussed below. The first metal pattern 852 may fill the recess in the lowermost second interlayer dielectric layer 820. The first metal pattern 852 may have a trapezoidal shape whose width decreases in a direction from bottom to top surfaces of the lowermost second interlayer dielectric layer 820.

The first metal pattern 852 may include a conductive material, such as metal. For example, the first metal pattern 852 may include copper. For another example, the first metal pattern 852 may include aluminum, tungsten, molybdenum, any combination thereof, or any alloy thereof.

The second bonding pad 1850 may be exposed on a top surface of the circuit chip 20. The second bonding pad 1850 may be disposed in the third interlayer dielectric layer 1820. For example, the second bonding pad 1850 may be provided in the first sub-interlayer dielectric layer 1821 and the second sub-interlayer dielectric layer 1822.

The second bonding pad 1850 may include a via part BVI in the first sub-interlayer dielectric layer 1821. The via part BVI may be a portion that protrudes (i.e., extends) from the second sub-interlayer dielectric layer 1822 to the first sub-interlayer dielectric layer 1821. The via part BVI may be electrically connected to the second conductive structure 1830. Therefore, the second bonding pad 1850 may be electrically connected to the integrated circuits 1700. The via part BVI may be a component that is the same as or corresponds to a via part BVI of FIG. 7 which will be discussed below.

The second bonding pad 1850 may include a second barrier pattern 1851 and a second metal pattern 1852. As will be discussed below, in a process for forming the second barrier pattern 1851, the second barrier pattern 1851 may conformally cover a recess in the first sub-interlayer dielectric layer 1821 and a recess in the second sub-interlayer dielectric layer 1822. The second barrier pattern 1851 may include at least one selected from titanium, tantalum, tungsten, and conductive metal nitride thereof. The second barrier pattern 1851 and the first barrier pattern 851 may include the same material. A bottom surface of the second barrier pattern 1851 may be in contact with the second conductive structure 1830.

The second metal pattern 1852 may be provided on the second barrier pattern 1851. The second metal pattern 1852 may fill a recess in the first sub-interlayer dielectric layer 1821 and a recess in the second sub-interlayer dielectric layer 1822. The second metal pattern 1852 may have a T shape. For example, the second metal pattern 1852 may include copper. For another example, the second metal pattern 1852 may include aluminum, tungsten, molybdenum, any combination thereof, or any alloy thereof. The second metal pattern 1852 and the first metal pattern 852 may include the same material.

Referring back to FIG. 5A, the first bonding pad 850 may have a first sidewall TSW1 and a second sidewall TSW2 that are opposite to each other in the first direction D1. The first sidewall TSW1 may have a negative slope, and the second sidewall TSW2 may have a positive slope. Alternatively, the first sidewall TSW1 may have a positive slope, and the second sidewall TSW2 may have a negative slope. In this case, the first and second sidewalls TSW1 and TSW2 may have their slopes opposite to each other.

The second bonding pad 1850 may have a third sidewall BSW1 and a fourth sidewall BSW2 that are opposite to each other. The third sidewall BSW1 may have a stepped structure that ascends along the first direction D1. The fourth sidewall BSW2 may have a stepped structure that ascends along a direction reverse to the first direction D1. For example, each of the third and fourth sidewalls BSW1 and BSW2 may have an cascade structure.

The first bonding pad 850 may have a first width in the first direction D1. The first width may be a distance in the first direction D1 between the first sidewall TSW1 and the second sidewall TSW2. For example, as the first and second sidewalls TSW1 and TSW2 have different slopes from each other, the first width may have various values. In addition, the first width may be a width in the first direction D1 of the recess in the second interlayer dielectric layer 820.

The second bonding pad 1850 may have a second width in the first direction D1. The second width may be a distance in the first direction D1 between the third sidewall BSW1 and the fourth sidewall BSW2. For example, as the third and fourth sidewalls BSW1 and BSW2 have a cascade structure, the second width may have various values. In addition, the second width may be a width in the first direction D1 of a recess in the third interlayer dielectric layer 1820. The second width may be a width in the first direction D1 of the recess in the first sub-interlayer dielectric layer 1821, and a width in the first direction D1 of the recess in the second sub-interlayer dielectric layer 1822.

The first width and the second width may be changed according to a certain vertical distance SH. The vertical distance SH may be a distance in a third direction D3 that intersects the first direction D1. The third direction D3 may be a direction perpendicular to the first substrate 100 and the second substrate 1000. The third direction D3 may be a direction along which the sensor chip (see 10 of FIG. 3) is stacked on the circuit chip (see 20 of FIG. 3). For example, the vertical distance SH may be the same as a height in the third direction D3 of the second interlayer dielectric layer 820.

A change in the first width according to the vertical distance SH may be defined to refer to a value of the degree to which the first width is changed. For example, the change in the first width may be defined to indicate a difference of a second value W1_F of the first width with respect to a first value W1_I of the first width. The first width of the first bonding pad 850 may gradually decrease along the third direction D3.

A change in the second width according to the vertical distance SH may be defined to refer to a value of the degree to which the second width is changed. For example, the change in the second width may be defined to indicate a difference of a fourth value W2_F of the second width with respect to a third value W2_I of the second width. The second width of the second bonding pad 1850 may be constant along the third direction D3 or may abruptly increase along the third direction D3.

The change in the second width according to the vertical distance SH may be greater than the change in the first width according to the vertical distance SH. As the second bonding pad 1850 includes the via part BVI in the first sub-interlayer dielectric layer 1821 and a line part in the second sub-interlayer dielectric layer 1822, a stepped structure may be formed between the line part and the via part BVI. The stepped structure may cause that the change in the second width according to the vertical distance SH is greater than the change in the first width according to the vertical distance SH.

A bottom surface of the first bonding pad 850 may be in contact with a top surface of the second bonding pad 1850. The bottom surface of the first bonding pad 850 and the top surface of the second bonding pad 1850 may have the same shape and the same area. For example, the bottom surface of the first bonding pad 850 and the top surface of the second bonding pad 1850 may have a circular shape or a tetragonal shape when viewed in plan. When each of the bottom surface of the first bonding pad 850 and the top surface of the second bonding pad 1850 have a circular shape, a diameter TD1 of the bottom surface may be the same as a diameter BD1 of the top surface. The diameter TD1 of the bottom surface and the diameter BD1 of the top surface may each be a distance in the first direction D1.

In some embodiments of the present inventive concepts, the bottom surface of the first bonding pad 850 and the top surface of the second bonding pad 1850 may have different shapes when viewed in plan, and may have different areas from each other. For example, the bottom surface of the first bonding pad 850 may have a circular or tetragonal shape when viewed in plan, and the top surface of the second bonding pad 1850 may have a tetragonal or circular shape when viewed in plan.

The circuit chip (see 20 of FIG. 3) and the sensor chip (see 10 of FIG. 3) may be connected by direct bonding. For example, the first bonding pad 850 and the second bonding pad 1850 may be vertically aligned and in contact with each other. Therefore, the second bonding pad 1850 may be directly bonded to the first bonding pad 850.

For example, the first metal pattern 852 may be directly bonded to the second metal pattern 1852, and the first barrier pattern 851 may be directly bonded to the second barrier pattern 1851. A Cu-to-Cu bonding may be given as a bonding between the first metal pattern 852 and the second metal pattern 1852. As a result, the integrated circuits (see 1700 of FIG. 3) of the circuit chip (see 20 of FIG. 3) may be electrically connected through the first and second bonding pads 850 and 1850 to the external bonding pads (see 600 of FIG. 3) or transistors of the sensor chip (see 10 of FIG. 3).

The second interlayer dielectric layer 820 may be directly attached to the third interlayer dielectric layer 1820. In this case, a chemical bond may be formed between the second interlayer dielectric layer 820 and the third interlayer dielectric layer 1820. For example, a chemical bond may be formed on a dielectric layer interface ITF.

In an image sensor according to aspects of the present inventive concepts, at least one bonding pad (e.g., the first bonding pad 850) may be formed with no via part in a bonding structure (e.g., the Cu-to-Cu bonding) between the circuit chip (see 20 of FIG. 3) and the sensor chip (see 10 of FIG. 3). When a bonding pad is formed with no via part, it may be possible to prevent hillock of copper (Cu) produced in a dual damascene process. Therefore, a current path may be prevented from being created due to hillock, and occurrence of leakage current may be prohibited. In addition, a short-circuit caused by hillock may be avoided to improve electrical properties of the image sensor.

FIGS. 5B, 5C, 6A, 6B, and 7 illustrate enlarged cross-sectional views of section M depicted in FIG. 3, showing bonding pads of an image sensor according to some embodiments of the present inventive concepts. In the embodiment that follows, a detailed description of technical features repetitive to those discussed above with reference to FIGS. 1 to 3 and 5A will be omitted, and a difference thereof will be discussed in detail.

Figure 5B:
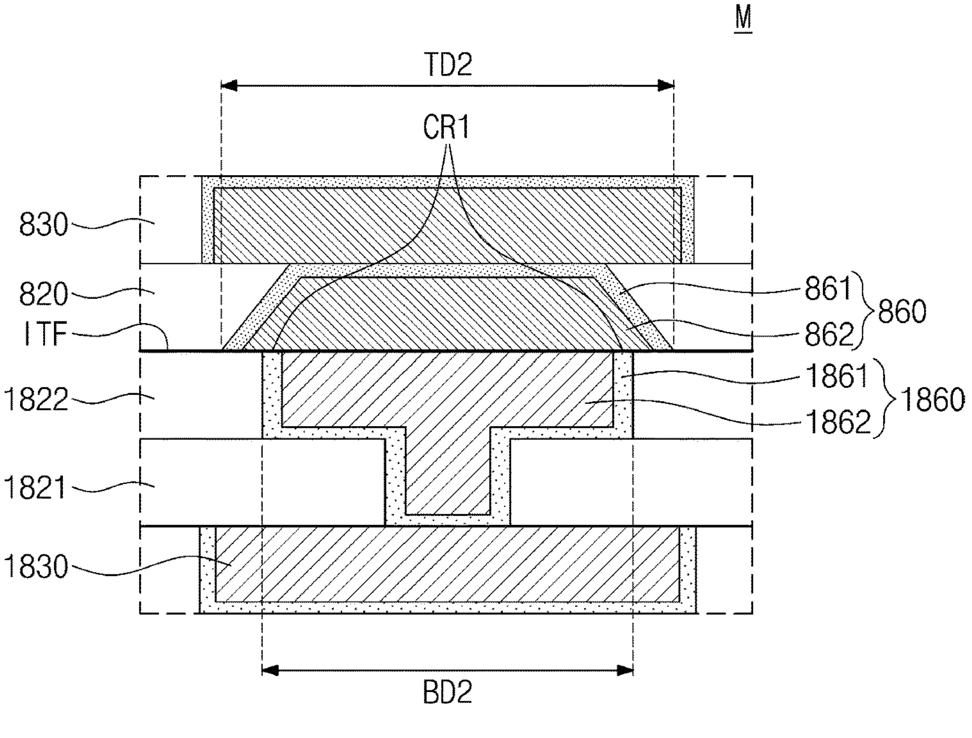
FIGS. 5B, 5C, 6A, 6B, and 7 illustrate enlarged cross-sectional views of section M depicted in FIG. 3, showing bonding pads of an image sensor according to some embodiments of the present inventive concepts.
Figure 5C:
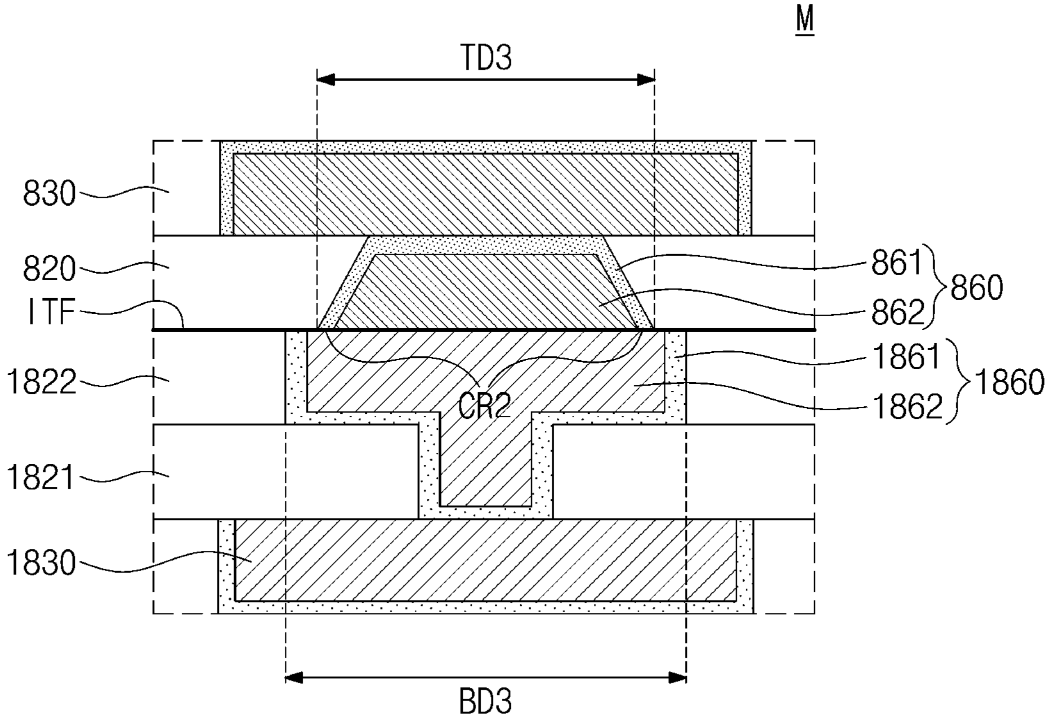

Referring to FIGS. 5B and 5C, a third bonding pad 860 may be exposed on the bottom surface of the sensor chip (see 10 of FIG. 3). The third bonding pad 860 may be disposed in the lowermost second interlayer dielectric layer 820. The third bonding pad 860 may be electrically connected to the first conductive structure 830. A top surface of the third bonding pad 860 may be in partial contact with the bottom surface of the first conductive structure 830.

The third bonding pad 860 may include a third barrier pattern 861 and a third metal pattern 862. The third barrier pattern 861 may be provided on a top surface and sidewalls of the third metal pattern 862. A top surface of the third barrier pattern 861 may be in contact with the first conductive structure 830. The third barrier pattern 861 may include the same material as that of the first barrier pattern (see 851 of FIG. 5A).

The third metal pattern 862 may be provided in the second interlayer dielectric layer 820. The third metal pattern 862 may be interposed between the third barrier pattern 861 and a fourth metal pattern 1862 which will be discussed below. The third metal pattern 862 may fill a recess in the lowermost second interlayer dielectric layer 820. The third metal pattern 862 may have a trapezoidal shape whose width decreases in a direction from the bottom to top surfaces of the lowermost second interlayer dielectric layer 820. The third metal pattern 862 may include the same material as that of the first metal pattern (see 852 of FIG. 5A). The third metal pattern 862 may include a conductive material, such as metal. For example, the conductive material may include copper.

A fourth bonding pad 1860 may be exposed on a top surface of the circuit chip 20. The fourth bonding pad 1860 may be disposed in the third interlayer dielectric layer 1820. For example, the fourth bonding pad 1860 may be provided in the first sub-interlayer dielectric layer 1821 and the second sub-interlayer dielectric layer 1822. The fourth bonding pad 1860 may include a via part in the first sub-interlayer dielectric layer 1821. The via part may be a portion that protrudes extending from the second sub-interlayer dielectric layer 1822 to the first sub-interlayer dielectric layer 1821. The via part may be electrically connected to the second conductive structure 1830.

The fourth bonding pad 1860 may include a fourth barrier pattern 1861 and a fourth metal pattern 1862. The fourth barrier pattern 1861 may conformally cover a recess in the first sub-interlayer dielectric layer 1821 and a recess in the second sub-interlayer dielectric layer 1822. The fourth barrier pattern 1861 may include the same material as that of the second barrier pattern (see 1851 of FIG. 5A).

The fourth metal pattern 1862 may be provided on the fourth barrier pattern 1861. The fourth metal pattern 1862 may fill the recess in the first sub-interlayer dielectric layer 1821 and the recess in the second sub-interlayer dielectric layer 1822. The fourth metal pattern 1862 may have a T shape. The fourth metal pattern 1862 may include the same material as that of the second metal pattern (see 862 of FIG. 5A). The fourth metal pattern 1862 may include a conductive material, such as metal. For example, the conductive material may include copper.

Referring back to FIG. 5B, a bottom surface of the third bonding pad 860 may be in contact with a top surface of the fourth bonding pad 1860. The bottom surface of the third bonding pad 860 may have a third width TD2 in the first direction (see D1 of FIG. 5A). The top surface of the fourth bonding pad 1860 may have a fourth width BD2 in the first direction (see D1 of FIG. 5A).

When the bottom surface of the third bonding pad 860 and the top surface of the fourth bonding pad 1860 have a circular shape when viewed in plan, the third width TD2 may be defined as a diameter of the bottom surface, and the fourth width BD2 may be defined as a diameter of the top surface. Alternatively, when the bottom surface of the third bonding pad 860 and the top surface of the fourth bonding pad 1860 have a square shape when viewed in plan, the third width TD2 may be defined as a diagonal length of the bottom surface, and the fourth width BD2 may be defined as a diagonal length of the top surface.

The third width TD2 may be greater than the fourth width BD2. For example, the bottom surface of the third bonding pad 860 has an area greater than that of the top surface of the fourth bonding pad 1860. The fourth bonding pad 1860 may be in contact with the third metal pattern 862 and may not be in contact with the third barrier pattern 861. A portion of the bottom surface of the third bonding pad 860 may be in contact with a top surface of the second sub-interlayer dielectric layer 1822 of the third interlayer dielectric layer 1820.

For example, the third bonding pad 860 may be directly bonded to the fourth bonding pad 1860. A bonding interface may include a Cu-to-Cu bonding region between the third metal pattern 862 and the fourth metal pattern 1862 and a first region CR1 where the third metal pattern 862 and the fourth barrier pattern 1861 are in contact with each other.

Referring back to FIG. 5C, the bottom surface of the third bonding pad 860 may be in contact with the top surface of the fourth bonding pad 1860. The bottom surface of the third bonding pad 860 may have a fifth width TD3 in the first direction (see D1 of FIG. 5A). The top surface of the fourth bonding pad 1860 may have a sixth width BD3 in the first direction (see D1 of FIG. 5A). The fifth width TD3 and the sixth width BD3 may respectively correspond to the third width (see TD2 of FIG. 5B) and the fourth width (see BD2 of FIG. 5B).

The fifth width TD3 may be less than the sixth width BD3. For example, the bottom surface of the third bonding pad 860 may have an area less than that of the top surface of the fourth bonding pad 1860. A bottom surface of the third bonding pad 860 may be in contact with the fourth metal pattern 1862, and may not be in contact with the fourth barrier pattern 1861. A portion of the top surface of the fourth bonding pad 1860 may be in contact with the bottom surface of the second interlayer dielectric layer 820.

For example, the third bonding pad 860 may be directly bonded to the fourth bonding pad 1860. A bonding interface may include a bonding region between the fourth metal pattern 1862 and the third metal pattern 862 and a second region CR2 where the fourth metal pattern 1862 and the third barrier pattern 861 are in contact with each other.

Figure 6A:
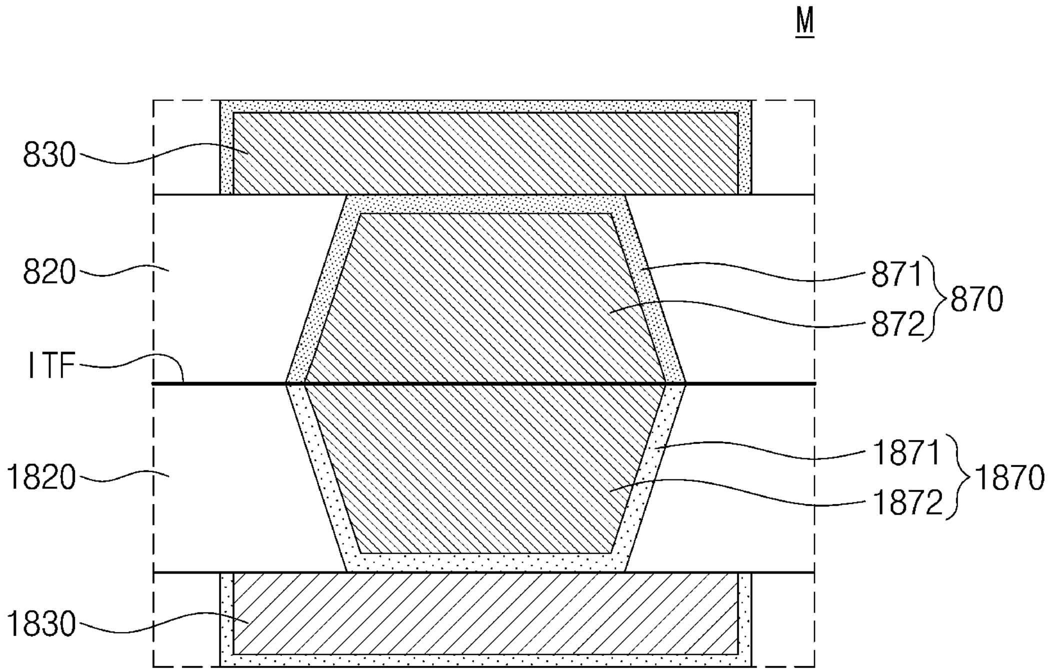
Figure 6B:
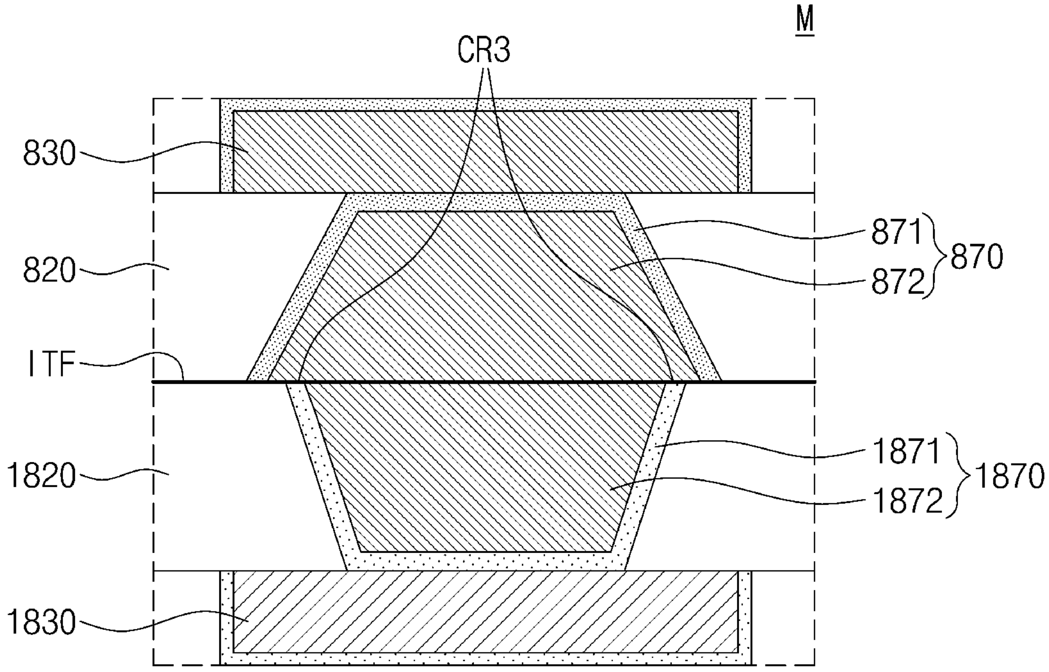

Referring to FIGS. 6A and 6B, a fifth bonding pad 870 may be exposed on the bottom surface of the sensor chip (see 10 of FIG. 3). The fifth bonding pad 870 may be disposed in the lowermost second interlayer dielectric layer 820. The fifth bonding pad 870 may be electrically connected to the first conductive structure 830. The fifth bonding pad 870 may include a fifth barrier pattern 871 and a fifth metal pattern 872.

The fifth barrier pattern 871 may be provided on a top surface and sidewalls of the fifth metal pattern 872. The fifth barrier pattern 871 may include the same material as that of the first barrier pattern (see 851 of FIG. 5A) and that of the third barrier pattern (see 861 of FIG. 5B). The fifth metal pattern 872 may be provided in the second interlayer dielectric layer 820. The fifth metal pattern 872 may include the same material as that of the first metal pattern (see 852 of FIG. 5A) and that of the third metal pattern (see 862 of FIG. 5B).

A sixth bonding pad 1870 may be exposed on the top surface of the circuit chip (see 20 of FIG. 3). The sixth bonding pad 1870 may be disposed in the third interlayer dielectric layer 1820. Unlike the second bonding pad (see 1850 of FIG. 5A) and the fourth bonding pad (see 1860 of FIG. 5B), the sixth bonding pad 1870 may not include a via part in the third interlayer dielectric layer 1820. For example, the fifth bonding pad 870 and the sixth bonding pad 1870 may be symmetrical about the third direction (see D3 of FIG. 3). The sixth bonding pad 1870 may include a sixth barrier pattern 1871 and a sixth metal pattern 1872.

The sixth barrier pattern 1871 may conformally cover a recess in the third interlayer dielectric layer 1820. The sixth barrier pattern 1871 may include the same material as that of the second barrier pattern (see 1851 of FIG. 5A) and that of the fourth barrier pattern (see 1861 of FIG. 5B).

The sixth metal pattern 1872 may be provided on the sixth barrier pattern 1871. The sixth metal pattern 1872 may fill the recess in the third interlayer dielectric layer 1820. The sixth metal pattern 1872 may have a T shape. The sixth metal pattern 1872 may include the same material as that of the second metal pattern (see 1852 of FIG. 5A) and that of the fourth metal pattern (see 1862 of FIG. 5B).

For example, the fifth metal pattern 872 may be directly bonded to the sixth metal pattern 1872, and the fifth barrier pattern 871 may be directly bonded to the sixth barrier pattern 1871. A Cu-to-Cu bonding may be given as a bonding between the fifth metal pattern 872 and the sixth metal pattern 1872. The second interlayer dielectric layer 820 may be directly attached to the third interlayer dielectric layer 1820. In this case, a chemical bond may be formed between the second interlayer dielectric layer 820 and the third interlayer dielectric layer 1820. For example, a chemical bond may be formed on a dielectric layer interface ITF.

Referring back to FIG. 6B, a bottom surface of the fifth bonding pad 870 may be in contact with a top surface of the sixth bonding pad 1870. The bottom surface of the fifth bonding pad 870 may have an area greater than that of the top surface of the sixth bonding pad 1870. The top surface of the sixth bonding pad 1870 may be in contact with the fifth metal pattern 872 and may not be in contact with the fifth barrier pattern 871. A portion of the bottom surface of the fifth bonding pad 870 may be in contact with a top surface of the third interlayer dielectric layer 1820.

For example, the fifth bonding pad 870 may be directly bonded to the sixth bonding pad 1870. A bonding interface may include a Cu-to-Cu bonding region between the fifth metal pattern 872 and the sixth metal pattern 1872 and a third region CR3 where the fifth metal pattern 872 and the sixth barrier pattern 1871 are in contact with each other.

Figure 7:
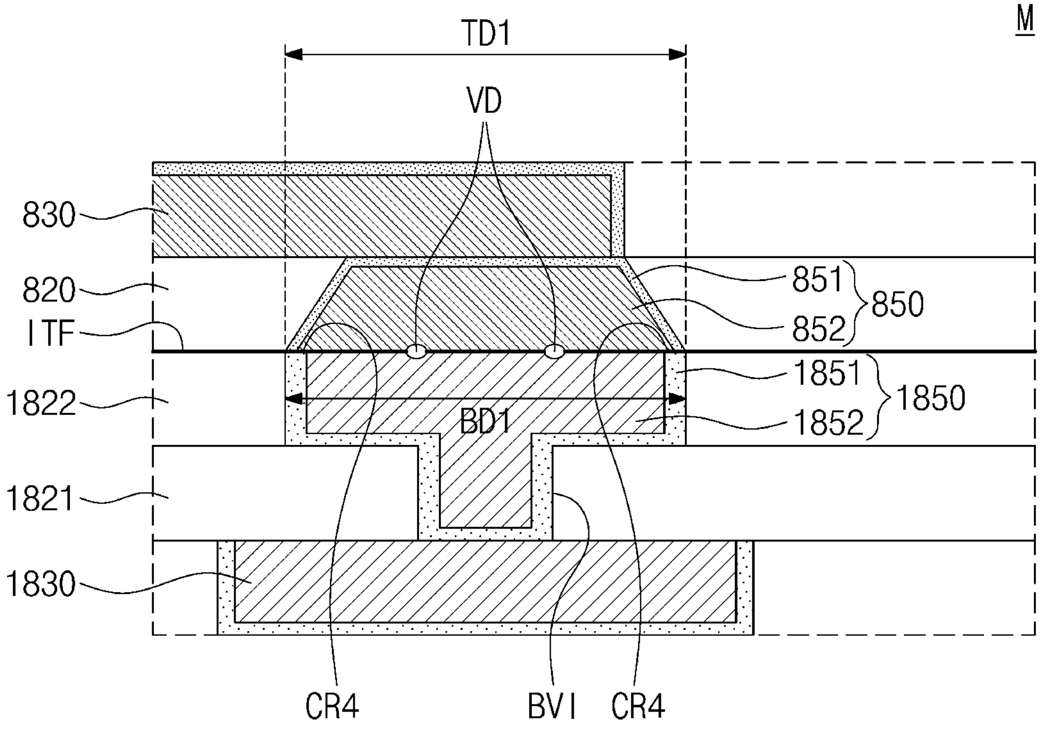

Referring to FIG. 7, the first bonding pad 850 and the second bonding pad 1850 may be directly bonded to each other. The first bonding pad 850 and the second bonding pad 1850 may be in contact with each other, and a Cu-to-Cu bonding structure may be provided between the first bonding pad 850 and the second bonding pad 1850. The bottom surface of the first bonding pad 850 and the top surface of the second bonding pad 1850 may be in contact with each other, and the bottom surface and the top surface may have the same area.

In the present embodiment, a plurality of voids VD may further be included between the first bonding pad 850 and the second bonding pad 1850. The void VD may be a pore that occurs in a bonding process of the first and second bonding pads 850 and 1850. For example, the Cu-to-Cu bonding structure may not have an occupying ratio of 100% at a bonding interface between the first and second bonding pads 850 and 1850. The void VD may have a circular or oval shape, but aspects of the present inventive concepts are not limited thereto.

The following will describe in detail a bonding interface when the first and second bonding pads 850 and 1850 are directly bonded to each other. The bonding interface may include a void region where a plurality of voids VD are present, a Cu-to-Cu bonding region between the first metal pattern 852 and the second metal pattern 1852, a barrier bonding region between the first barrier pattern 851 and the second barrier pattern 1851, and a fourth region CR4 wherein the second barrier pattern 1851 is in contact with the first metal pattern 852. As will be discussed below, in a process for forming the second bonding pad 1850, the second barrier pattern 1851 may conformally cover the recesses in the first and second sub-interlayer dielectric layers 1821 and 1822 to be deposited thicker than the first barrier pattern 851. Therefore, the bonding interface may include the fourth region CR4.

Although not shown, according to some embodiments of the present inventive concepts, the bottom surface of the first bonding pad 850 may have a different shape from that of the top surface of the second bonding pad 1850. In addition, the bottom surface and the top surface may have different areas from each other.

FIG. 4 illustrates a cross-sectional view taken along line II-II' of FIG. 2, showing an image sensor according to some embodiments of the present inventive concepts. In the embodiment that follows, a detailed description of technical features repetitive to those discussed above with reference to FIGS. 1 to 3 and 5A to 7 will be omitted, and a difference thereof will be discussed in detail.

Referring to FIGS. 2 and 4, the image sensor may further include a middle chip 30 interposed between the sensor chip 10 and the circuit chip 20. The middle chip 30 may include a third wiring layer 2800 and a third substrate 2000. The third wiring layer 2800 may be interposed between the first wiring layer 800 and the third substrate 2000. The second wiring layer 1800 of the circuit chip 20 may be provided below the third substrate 2000.

The third substrate 2000 may be provided with driver transistors 2700 on a top surface thereof. The driver transistors 2700 may include the conversion gain transistor Cx, the reset transistor Rx, the source follower transistor Sx, and the selection transistor Ax that are discussed with reference to FIG. 1. According to the present embodiment, the photoelectric conversion area PD, the transfer transistor Tx, and the floating diffusion area FD of FIG. 1 may be provided in or on the first substrate 100 of the sensor chip 10. The middle chip 30 may be provided on the third substrate 2000 with the conversion gain transistor Cx, the reset transistor Rx, the source follower transistor Sx, and the selection transistor Ax of FIG. 1.

The third wiring layer 2800 may include fourth interlayer dielectric layers 2820 and third conductive structures 2830. The third conductive structures 2830 may be provided between or in the fourth interlayer dielectric layers 2820. The third conductive structures 2830 may be electrically connected to the driver transistors 2700. The third conductive structures 2830 may include contacts, wiring lines, and vias.

The sensor chip 10 may include a first bonding pad 850. The first bonding pad 850 may be exposed on the bottom surface of the sensor chip 10. The first bonding pad 850 may be disposed in the lowermost second interlayer dielectric layer 820. The first bonding pad 850 may be electrically connected to the first conductive structure 830.

The middle chip 30 may include a seventh bonding pad 2850. The seventh bonding pad 2850 may be exposed on a top surface of the middle chip 30. The seventh bonding pad 2850 may be disposed in an uppermost fourth interlayer dielectric layer 2820. The seventh bonding pad 2850 may be electrically connected to the driver transistors 2700. The seventh bonding pad 2850 may include a conductive material, such as metal. For example, the seventh bonding pad 2850 may include copper. Alternatively, the seventh bonding pad 2850 may include one or more of aluminum, tungsten, titanium, or any alloy thereof.

The middle chip 30 and the sensor chip 10 may be connected by direct bonding. For example, the first bonding pad 850 and the seventh bonding pad 2850 may be vertically aligned and in contact with each other. Therefore, the seventh bonding pad 2850 may be directly bonded to the first bonding pad 850. As a result, the driver transistors 2700 of the middle chip 30 may be electrically connected through the first and seventh bonding pads 850 and 2850 to the floating diffusion areas FD of the sensor chip 10.

The second interlayer dielectric layer 820 may be directly attached to the fourth interlayer dielectric layer 2820. In this case, a chemical bond may be formed between the second interlayer dielectric layer 820 and the fourth interlayer dielectric layer 2820.

The middle chip 30 may further include through vias 2840 that penetrate the third substrate 2000. Each of the through vias 2840 may electrically connect the third wiring layer 2800 to the second wiring layer 1800. For example, the middle chip 30 and the circuit chip 20 may be electrically connected to each other through the through vias 2840.

Figure 8A:
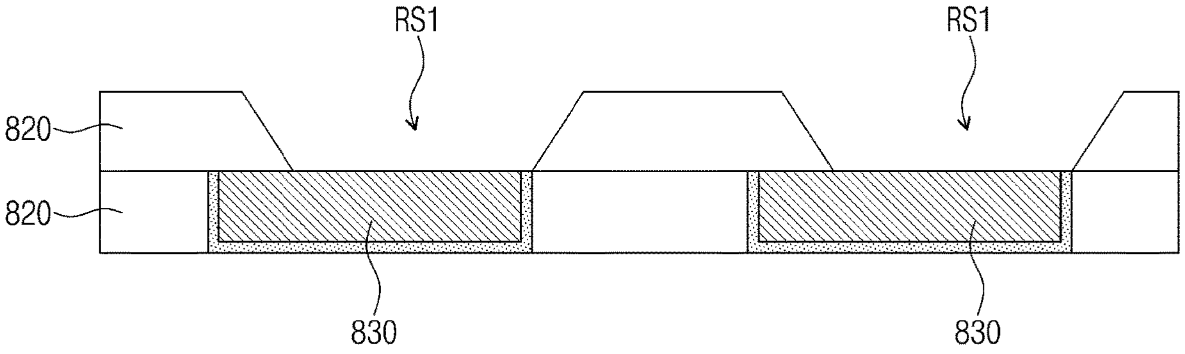
FIGS. 8A to 8D, 9A to 9E, and 10 illustrate cross-sectional views showing a method of fabricating an image sensor according to some embodiments of the present inventive concepts.
Figure 8B:
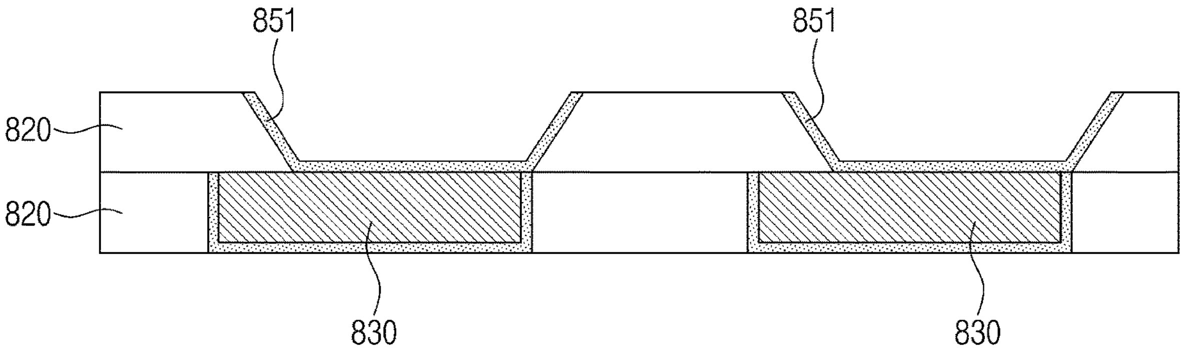
Figure 8C:
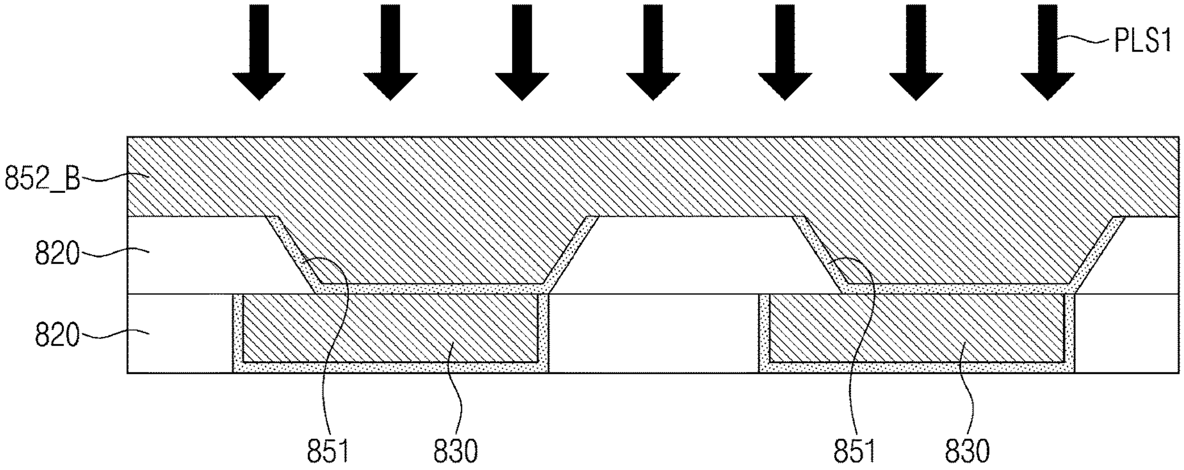
Figure 8D:
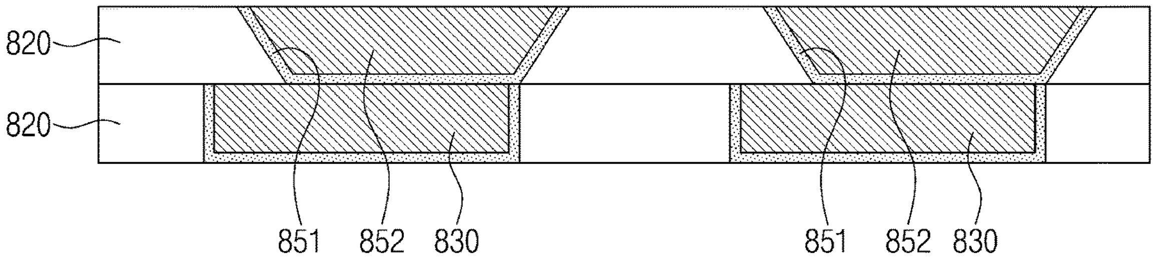
Figure 9A:
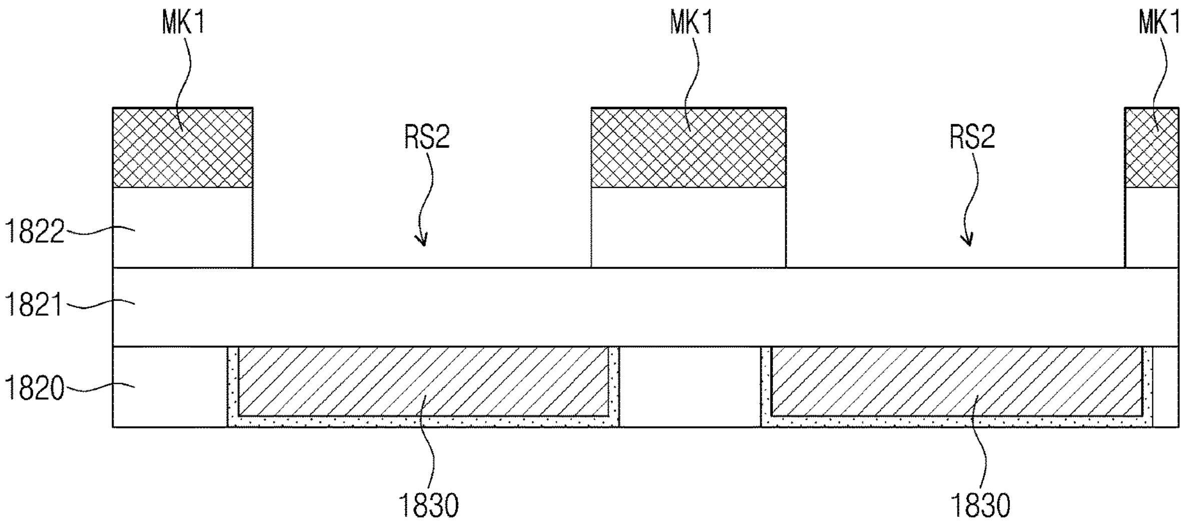
Figure 9B:
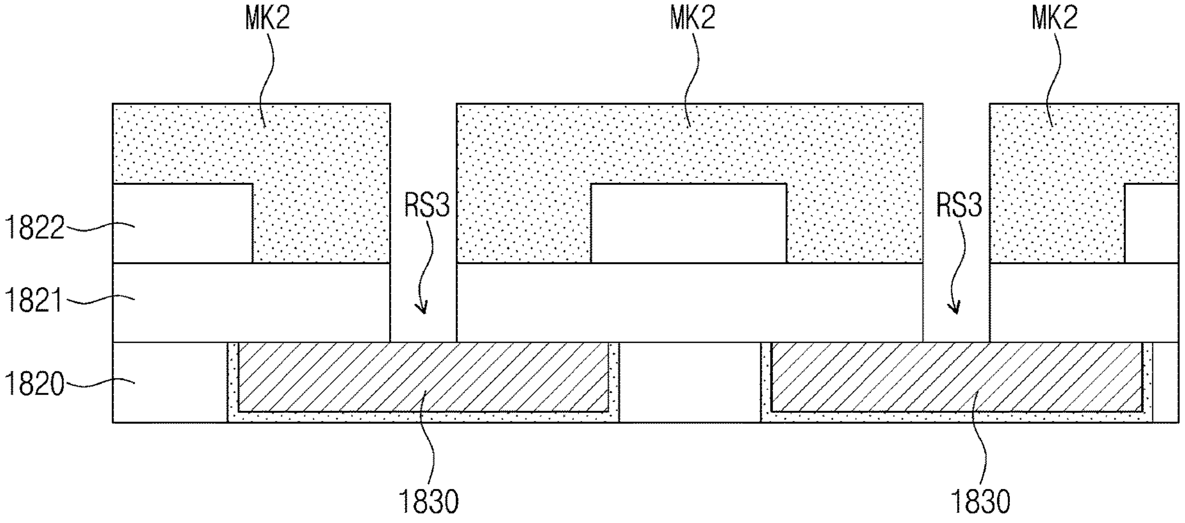
Figure 9C:
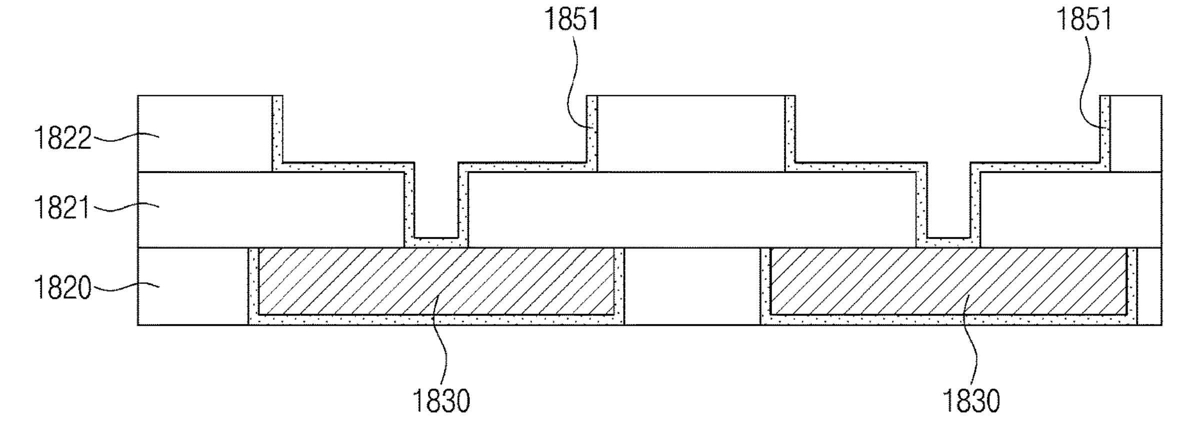
Figure 9D:
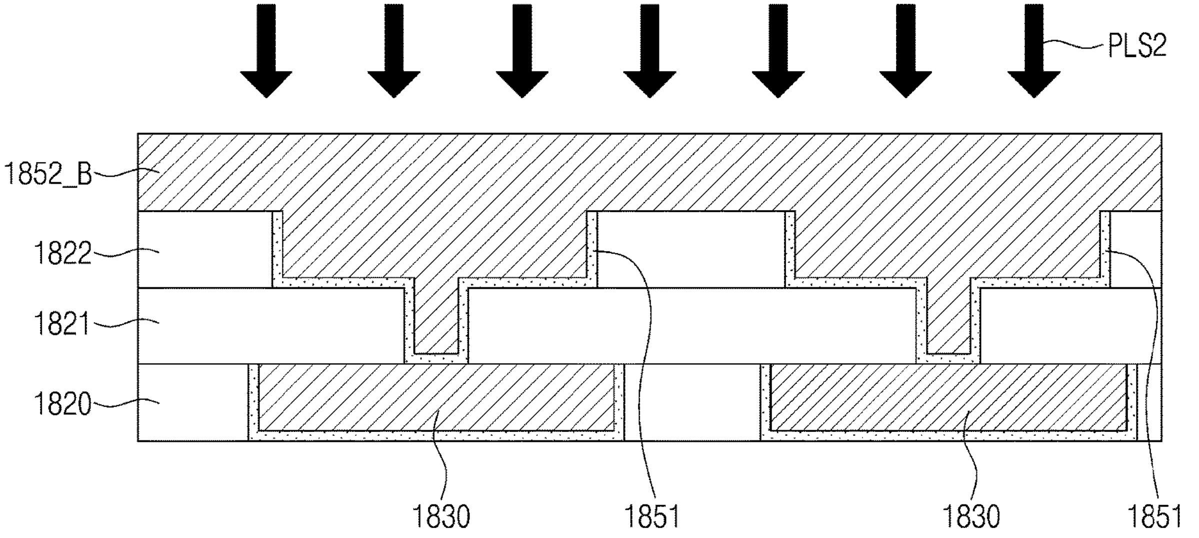
Figure 9E:
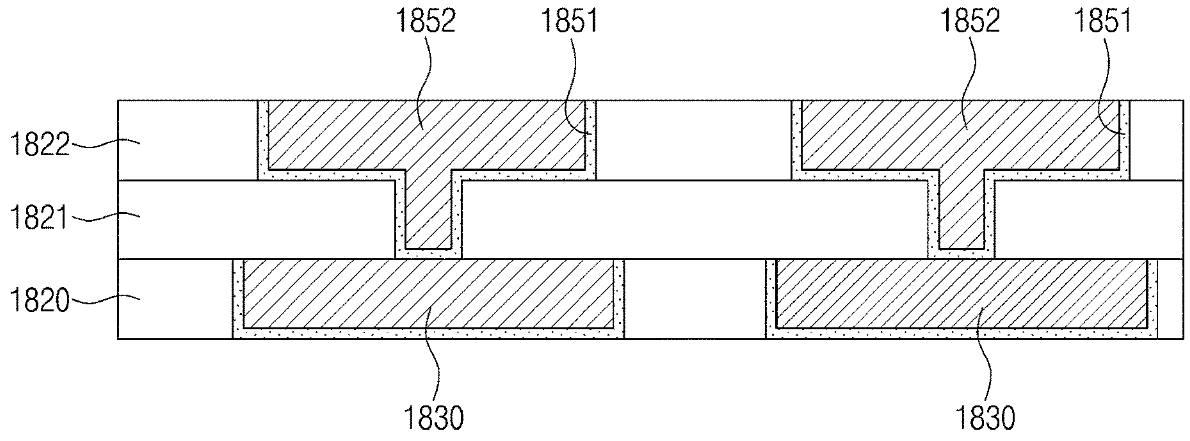
Figure 10:
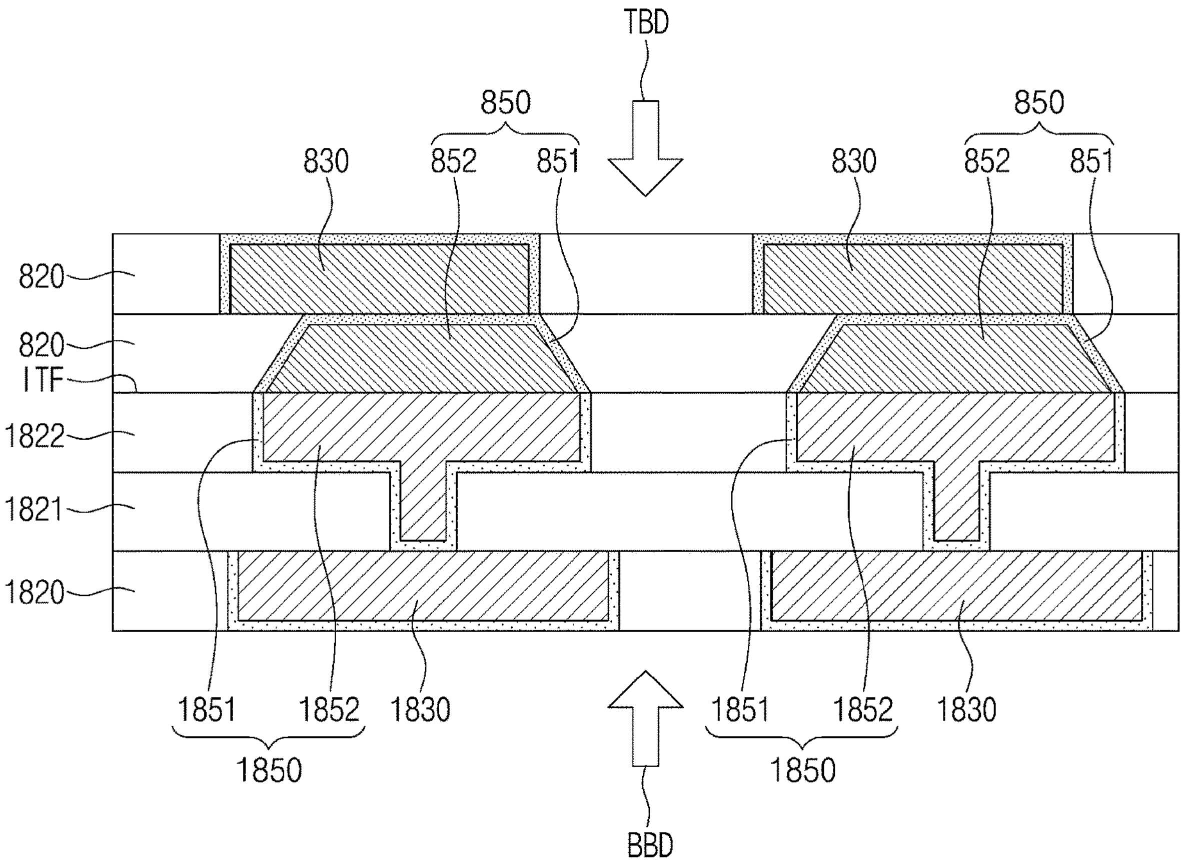

FIGS. 8A to 8D, 9A to 9E, and 10 illustrate cross-sectional views showing a method of fabricating an image sensor according to some embodiments of the present inventive concepts. FIGS. 8A to 8D illustrate enlarged cross-sectional views showing the first wiring layer 800 in section M of FIG. 3. FIGS. 9A to 9E illustrate enlarged views showing the second wiring layer 1800 in section M of FIG. 3. FIG. 10 illustrates an enlarged cross-sectional view of section M depicted in FIG. 3, showing bonding between the circuit chip (see 20 of FIG. 3) and the sensor chip (see 10 of FIG. 3).

Referring to FIGS. 8A to 8D, a first substrate may be provided on which a sensor chip (see 10 of FIG. 3) is formed. The first substrate (see 100 of FIG. 3) may have a first surface (see 100*a* of FIG. 3) and a second surface (see 100*b* of FIG. 3) that are opposite to each other, and may have a first conductivity type (e.g., p type) or may be doped with impurities to have the first conductivity type.

A dielectric layer (see 400 of FIG. 3) may be formed on the first surface of the first substrate. A grid-shape fence pattern (see 300 of FIG. 3) may be formed on the dielectric layer. Color filters (see CF of FIG. 3) may be formed on the fence pattern. A microlens layer (see 500 of FIG. 3) may be formed on the color filters.

The second surface of the first substrate may be patterned to form a device isolation pattern (see 240 of FIG. 3) and a separation pattern (see 200 of FIG. 3). A ground area (see GND of FIG. 3), a floating diffusion area (see FD of FIG. 3), and an active area may be formed in each of pixel regions (see PX of FIG. 3) that are divided by the separation pattern. The ground area may be doped to have the first conductivity type (e.g., p+ type), and each of the floating diffusion area and the active area may be doped to have a second conductivity type (e.g., n type). A conductive layer may be formed on the second surface of the first substrate, and the conductive layer may be patterned to form a buried gate pattern (see 700 of FIG. 3).

A first wiring layer (see 800 of FIG. 3) may be formed on the second surface of the first substrate. The formation of the first wiring layer may include depositing a first interlayer dielectric layer (see 810 of FIG. 3), forming vias and wiring lines in the first interlayer dielectric layer, depositing second interlayer dielectric layers 820, and forming in the second interlayer dielectric layers 820 a first conductive structure 830 that correspond to the wiring lines.

Referring to FIG. 8A, a first recess RS1 may be formed in an uppermost one of a plurality of second interlayer dielectric layers 820. The formation of the first recess RS1 may include forming mask patterns on the uppermost second interlayer dielectric layer 820, using the mask patterns as an etching mask to selectively remove a portion of the second interlayer dielectric layer 820, and removing the mask patterns. The first recess RS1 may be formed by performing a dry etching process or a wet etching process. The first recess RS1 may partially expose a top surface of the first conductive structure 830.

Referring to FIG. 8B, a first barrier pattern 851 may be formed to conformally cover lateral surfaces of the first recess RS1 and the exposed top surface of the first conductive structure 830. The first barrier pattern 851 may be formed by performing a physical vapor deposition (PVD) process so as to include at least one selected from titanium, tantalum, tungsten, and conductive metal nitride thereof. The conductive metal nitride may be included such that the first barrier pattern 851 may be formed to have a low resistance.

Referring to FIG. 8C, a first metal bulk 852_B may be formed on the first barrier pattern 851 and the uppermost second interlayer dielectric layer 820. The first metal bulk 852_B may include a conductive material, such as metal. For example, the first metal bulk 852_B may include copper. The first metal bulk 852_B may be formed by performing an electroplating (EP) process. After the formation of the first metal bulk 852_B, a first chemical mechanical polishing (CMP) process PLS1 may be performed to uniformly remove the first metal bulk 852_B.

Referring to FIG. 8D, the first CMP process (see PLS1 of FIG. 8C) may be performed until the second interlayer dielectric layer 820 is revealed. As the second interlayer dielectric layer 820 includes a dielectric material such as silicon oxide, the second interlayer dielectric layer 820 may be used as a stop layer of the first CMP process (see PLS1 of FIG. 8C) to form a first metal pattern 852. A top surface of the first metal pattern 852 may be substantially coplanar with that of the first barrier pattern 851 and that of an uppermost second interlayer dielectric layer 820.

Referring to FIGS. 9A to 9E, a second substrate (see 1000 of FIG. 3) may be provided on which a circuit chip (see 20 of FIG. 3) is formed. Integrated circuits (see 1700 of FIG. 3) may be formed on the second substrate. The integrated circuits may include gate structures and source/drain patterns. A second wiring layer (see 1800 of FIG. 3) may be formed on the second substrate. The formation of the second wiring layer may include depositing third interlayer dielectric layers (see 1820 of FIG. 3) and forming vias and wiring lines in the third interlayer dielectric layers. The wiring lines may correspond to the second conductive structures 1830.

Referring to FIG. 9A, an uppermost one of the third interlayer dielectric layers 1820 may include a first sub-interlayer dielectric layer 1821 and a second sub-interlayer dielectric layer 1822 on the first sub-interlayer dielectric layer 1821. A second recess RS2 may be formed in the second sub-interlayer dielectric layer 1822. The formation of the second recess RS2 may include forming a first mask MK1 on the second sub-interlayer dielectric layer 1822 and using the first mask MK1 as an etching mask to selectively remove a portion of the second sub-interlayer dielectric layer 1822. The second recess RS2 may be formed by performing a dry etching process or a wet etching process.

The second recess RS2 may partially expose a top surface of the first sub-interlayer dielectric layer 1821.

Referring to FIG. 9B, a third recess RS3 may be formed in the first sub-interlayer dielectric layer 1821. The formation of the third recess RS3 may include selectively removing the first mask MK1, forming a second mask MK2 on the first and second sub-interlayer dielectric layers 1821 and 1822, and using the second mask MK2 as an etching mask to selectively remove a portion of the first sub-interlayer dielectric layer 1821. The third recess RS3 may be formed by performing a dry etching process or a wet etching process. The third recess RS3 may partially expose a top surface of the second conductive structure 1830.

Referring to FIG. 9C, a second barrier pattern 1851 may be formed to conformally cover lateral and bottom surfaces of the second recess (see RS2 of FIG. 9A), lateral surfaces of the third recess (RS3 of FIG. 9B), and the exposed top surface of the second conductive structure 1830. The second barrier pattern 1851 may be formed by performing a physical vapor deposition (PVD) process so as to include at least one selected from titanium, tantalum, tungsten, and conductive metal nitride thereof. The conductive metal nitride may be included such that the second barrier pattern 1851 may be formed to have a low resistance.

According to an embodiment of the present inventive concepts, it may be required that each of the second recess (RS2 of FIG. 9A) and the third recess (RS3 of FIG. 9B) need a large planar surface for deposition thereof, and thus a physical vapor deposition (PVD) process may require a long time to form the second barrier pattern 1851. The second barrier pattern 1851 may be formed thicker than the first barrier pattern (see 851 of FIG. 8B).

Referring to FIG. 9D, a second metal bulk 1852_B may be formed on the second barrier pattern 1851 and the second sub-interlayer dielectric layer 1822. The second metal bulk 1852_B may include a conductive material, such as metal. For example, the second metal bulk 1852_B may include copper. The second metal bulk 1852_B may be formed by performing an electroplating (EP) process. After the formation of the second metal bulk 1852_B, a second chemical mechanical polishing (CMP) process PLS2 may be performed to uniformly remove the second metal bulk 1852_B.

Referring to FIG. 9E, the second CMP process (see PLS2 of FIG. 9D) may be performed until the second sub-interlayer dielectric layer 1822 is revealed. As the second sub-interlayer dielectric layer 1822 includes a dielectric material such as silicon oxide, the second sub-interlayer dielectric layer 1822 may be used as a stop layer of the second CMP process (see PLS2 of FIG. 9D) to form a second metal pattern 1852. A top surface of the second metal pattern 1852 may be substantially coplanar with that of the second barrier pattern 1851 and that of the second sub-interlayer dielectric layer 1822.

Referring to FIGS. 3 and 10, the sensor chip 10 in which the first wiring layer 800 and the first bonding pad 850 are formed may be bonded to the circuit chip 20 in which the second wiring layer 1800 and the second bonding pad 1850 are formed. For example, the sensor chip 10 may be turned upside down to expose the first surface 100*a* of the first substrate 100. The first and second bonding pads 850 and 1850 may be bonded by allowing the first bonding pad 850 of the sensor chip 10 to be directed in a vertical downward direction TBD and by allowing the second bonding pad 1850 of the circuit chip 20 to be directed in a vertical upward direction BBD. A bottom surface of the first bonding pad 850 may be in contact with a top surface of the second bonding pad 1850, and the bottom and top surfaces in contact with each other may have the same area.

The first and second bonding pads 850 and 1850 may be bonded to each other. For example, a Cu-to-Cu bonding may be given as a bonding between the first metal pattern 852 and the second metal pattern 1852. The first barrier pattern 851 and the second barrier pattern 1851 may be directly bonded to each other. The second interlayer dielectric layer 820 may be directly attached to the third interlayer dielectric layer 1820. In this case, a chemical bond may be formed between the second interlayer dielectric layer 820 and the third interlayer dielectric layer 1820. For example, a chemical bond may be formed on the dielectric layer interface ITF, and thus the sensor chip 10 and the circuit chip 20 may be bonded to each other.

According to a method of fabricating an image sensor in accordance with the present inventive concepts, the number of layers concerned with the bonding between the circuit chip 20 and the sensor chip 10, and therefore a fabrication process may be simplified. For example, there may be a reduction in the number of interlayer dielectric layers included in bonding pads. In addition, the bonding pad may be formed with no via part to simplify a wiring structure and to reduce the number of fabrication process steps for patterning, which may result in an increase in efficiency of fabrication process for the image sensor. There may be no limitation imposed on effects achieved through the aspects of the present inventive concepts disclosed herein.

In an image sensor according to aspects of the present inventive concepts, at least one bonding pad may be formed with no via part in a bonding structure (e.g., Cu-to-Cu bonding) between a circuit chip and an image sensor chip, and therefore it may be possible to reduce the number of bonding pads substantially concerned with the bonding structure. For example, there may be a reduction in the number of bonding pads serving as dummy pads, and it may be possible to prevent hillock of copper included in the bonding pad. Hence, a current path may be prevented from being created due to hillock, and the occurrence of leakage current may be prohibited.

In an image sensor according to the present inventive concepts, the number of layers concerned with bonding between a circuit chip and an image sensor chip, and a fabrication process may be simplified. In addition, a bonding pad may be formed with no via part to simplify a wiring structure and to reduce the number of fabrication process steps for patterning, which may result in an increase in efficiency of fabrication process for the image sensor.

In conclusion, aspects of the present inventive concepts may improve electrical properties of an image sensor and to increase efficiency of fabrication process.

Although aspects of the present inventive concepts have been described in connection with some embodiments of the present inventive concepts illustrated in the accompanying drawings, it will be understood to those skilled in the art that various changes and modifications may be made without departing from the technical spirit and essential feature of the aspects of the present inventive concepts. It will be apparent to those skilled in the art that various substitution, modifications, and changes may be thereto without departing from the scope and spirit of the aspects of the present inventive concepts.

What is claimed is:

1. An image sensor, comprising:

a circuit chip; and an image sensor chip on the circuit chip, wherein the image sensor chip includes:

a first substrate extending in a first direction and a second direction;

a first interlayer dielectric layer between the first substrate and the circuit chip; and a first bonding pad in the first interlayer dielectric layer, wherein the first bonding pad has a first width in the first direction, wherein the circuit chip includes:

a second substrate;

a second interlayer dielectric layer and a third interlayer dielectric layer that are sequentially stacked on the second substrate; and a second bonding pad in the second and third interlayer dielectric layers, wherein the second bonding pad has a second width in the first direction, wherein a bottom surface of the first bonding pad is in contact with a top surface of the second bonding pad, and wherein a change in the second width along a third direction is greater than a change in the first width along the third direction, the third direction intersects the first direction and the second direction, wherein the bottom surface of the first bonding pad and the top surface of the second bonding pad have different shapes from each other in plan view.

2. The image sensor of claim 1, wherein the second width is constant or increases along the third direction.

3. The image sensor of claim 1, wherein the first width gradually decreases along the third direction.

4. The image sensor of claim 1, wherein the first bonding pad includes:

a first metal pattern; and a first barrier pattern on a top surface and lateral surfaces of the first metal pattern, wherein the second bonding pad includes:

a second barrier pattern; and a second metal pattern on the second barrier pattern, wherein the first and second metal patterns include copper, aluminum, tungsten, molybdenum, or a combination thereof.

5. The image sensor of claim 4, wherein the top surface of the second bonding pad is in contact with the first metal pattern and is not in contact with the first barrier pattern.

6. The image sensor of claim 5, wherein a portion of the bottom surface of the first bonding pad is in contact with a top surface of the third interlayer dielectric layer.

7. The image sensor of claim 4, wherein the bottom surface of the first bonding pad is in contact with the second metal pattern and is not in contact with the second barrier pattern.

8. The image sensor of claim 7, wherein a portion of the top surface of the second bonding pad is in contact with a bottom surface of the first interlayer dielectric layer.

9. The image sensor of claim 1, wherein a third width in the first direction of the bottom surface of the first bonding pad is greater than a fourth width in the first direction of the top surface of the second bonding pad.

10. The image sensor of claim 1, wherein a third width in the first direction of the bottom surface of the first bonding pad is less than a fourth width in the first direction of the top surface of the second bonding pad.

11. The image sensor of claim 1, wherein the first substrate has a first surface and a second surface that are opposite to each other and includes a photoelectric conversion area, wherein the image sensor chip further includes a separation pattern in the first substrate, the separation pattern defining a pixel region, and wherein the pixel region includes:

a device isolation pattern that defines an active area adjacent to the second surface in the pixel region; and a transistor on the second surface.

12. The image sensor of claim 11, wherein the image sensor chip further includes a buried gate pattern on the active area, wherein the active area includes a floating diffusion area adjacent to the buried gate pattern, wherein the buried gate pattern extends in the first substrate.

13. The image sensor of claim 12, wherein the image sensor chip further includes:

a plurality of color filters on the first surface of the first substrate; and a plurality of microlenses on the color filters.

14. An image sensor, comprising:

a circuit chip; and an image sensor chip on the circuit chip, wherein the image sensor chip includes:

a first substrate extending in a first direction and a second direction;

a first interlayer dielectric layer between the first substrate and the circuit chip;

a first conductive structure between the first substrate and the first interlayer dielectric layer; and a first bonding pad in the first interlayer dielectric layer, wherein the circuit chip includes:

a second substrate;

a second interlayer dielectric layer on the second substrate;

a second conductive structure between the second substrate and the second interlayer dielectric layer; and a second bonding pad in the second interlayer dielectric layer, wherein a top surface of the first bonding pad is in contact with the first conductive structure, wherein a bottom surface of the first bonding pad is in contact with a top surface of the second bonding pad, and wherein a bottom surface of the second bonding pad is in contact with the second conductive structure, wherein the first bonding pad and the second bonding pad have a width in the first direction, wherein a first width of the top surface of the first bonding pad is less than a second width of the bottom surface of the first bonding pad, wherein a third width of the top surface of the second bonding pad is greater than a fourth width of the bottom surface of the second bonding pad, wherein the first width is greater than the fourth width, and wherein a plurality of voids are included between the first and second bonding pads that are in contact with each other.

15. The image sensor of claim 14, wherein the bottom surface of the first bonding pad and the top surface of the second bonding pad have different shapes from each other in plan view.

16. The image sensor of claim 14, wherein the second bonding pad includes a line part having the third width and a via part having the fourth width, and includes a stepped structure between the line part and the via part.

17. An image sensor, comprising:

a circuit chip; and an image sensor chip on the circuit chip, wherein the image sensor chip includes:

a first substrate that has a first surface and a second surface that are opposite to each other and photoelectric conversion areas, wherein the first substrate includes a pixel region and an optical black region;

a separation pattern that defines the photoelectric conversion areas in the first substrate;

a dielectric layer that covers the first surface;

a plurality of color filters on the dielectric layer;

a protective layer between the dielectric layer and the color filters;

a plurality of microlenses on corresponding color filters;

a device isolation pattern adjacent to the second surface, the device isolation pattern defining an active area;

a buried gate pattern on the second surface;

a first wiring layer on the buried gate pattern; and a first bonding pad between the first wiring layer and the circuit chip, wherein the circuit chip includes:

a second substrate on which integrated circuits are provided;

a second wiring layer on the second substrate; and a second bonding pad between the second wiring layer and the image sensor chip, wherein the first wiring layer and the second wiring layer face each other and are electrically connected through the first and second bonding pads, wherein the first and second bonding pads are bonded to each other, wherein the first bonding pad has a first sidewall and a second sidewall that are opposite to each other, the first sidewall having a negative slope, and the second sidewall having a positive slope, wherein the second bonding pad has a third sidewall and a fourth sidewall that are opposite to each other, wherein each of the third and fourth sidewalls has a stepped structure, wherein a bottom surface of the first bonding pad is in contact with a top surface of the second bonding pad, and wherein the bottom surface of the first bonding pad and the top surface of the second bonding pad have different shapes from each other in plan view.

18. The image sensor of claim 17, wherein the bottom surface of the first bonding pad and the top surface of the second bonding pad have the same area.

19. The image sensor of claim 17, wherein the bottom surface of the first bonding pad has a circular or tetragonal shape, and wherein the top surface of the second bonding pad has a tetragonal or circular shape.

* * * * *